(12) United States Patent
Boyd et al.

(10) Patent No.: US 7,264,007 B2
(45) Date of Patent: Sep. 4, 2007

(54) METHOD AND APPARATUS FOR CLEANING A SUBSTRATE USING MEGASONIC POWER

(75) Inventors: John M. Boyd, Atascadero, CA (US); Mike Ravkin, Sunnyvale, CA (US); Fred C. Redeker, Fremont, CA (US); John de Larios, Palo Alto, CA (US)

(73) Assignee: Lam Research Corporation, Fremont, CA (US)

( * ) Notice: Subject to any disclaimer, the term of this patent is extended or adjusted under 35 U.S.C. 154(b) by 537 days.

(21) Appl. No.: 10/611,140

(22) Filed: Jun. 30, 2003

(65) Prior Publication Data

US 2004/0069319 A1 Apr. 15, 2004

Related U.S. Application Data

(63) Continuation-in-part of application No. 10/261,839, filed on Sep. 30, 2002.

(51) Int. Cl.
*B08B 3/12* (2006.01)

(52) U.S. Cl. .................... 134/95.2; 134/99.1; 134/184; 134/902

(58) Field of Classification Search ................ 134/1.3, 134/26, 34, 36, 95.2, 99.1, 102.3, 184, 901, 134/902
See application file for complete search history.

(56) References Cited

U.S. PATENT DOCUMENTS

| | | | |
|---|---|---|---|
| 3,953,265 A | 4/1976 | Hood | |
| 4,086,870 A | 5/1978 | Canavello et al. | |
| 4,367,123 A | 1/1983 | Beck | |
| 4,444,492 A | 4/1984 | Lee | |
| 4,838,289 A | 6/1989 | Kottman et al. | 134/153 |
| 5,102,494 A | 4/1992 | Harvey et al. | |
| 5,180,431 A | 1/1993 | Sugimoto et al. | |
| 5,271,774 A | 12/1993 | Leenaars et al. | 134/31 |
| 5,294,257 A | 3/1994 | Kelly et al. | |
| 5,343,234 A | 8/1994 | Kuehnle | |
| 5,361,449 A | 11/1994 | Akimoto | |
| 5,472,502 A | 12/1995 | Batchelder | 118/52 |
| 5,558,111 A | 9/1996 | Lofaro | 134/92.2 |
| 5,601,655 A | 2/1997 | Bok et al. | |

(Continued)

FOREIGN PATENT DOCUMENTS

EP    0 905 746 A1    3/1999

(Continued)

OTHER PUBLICATIONS

Owa et al. "*Immersion lithography; its potential performance and issues*", Proceedings of the SPIE, SPIE, Bellingham, VA, US, vol. 5040, No. 1, Feb. 28, 2003, pp. 724-733, XP002294500.

(Continued)

*Primary Examiner*—Joseph L. Perrin
(74) *Attorney, Agent, or Firm*—Martine Penilla & Gencarella, LLP

(57) ABSTRACT

A method for processing a substrate is provided that includes generating a fluid meniscus on a surface of the substrate and applying acoustic energy to the fluid meniscus. The method also includes moving the fluid meniscus over the surface the substrate to process the surface of the substrate.

12 Claims, 25 Drawing Sheets

U.S. PATENT DOCUMENTS

| | | |
|---|---|---|
| 5,660,642 A | 8/1997 | Britten .................. 134/30 |
| 5,705,223 A | 1/1998 | Bunkofske .................. 427/240 |
| 5,709,757 A | 1/1998 | Hatano et al. ........... 134/22.14 |
| 5,807,522 A | 9/1998 | Brown et al. |
| 5,830,334 A | 11/1998 | Kobayashi |
| 5,882,433 A | 3/1999 | Ueno .................. 134/31 |
| 5,893,004 A | 4/1999 | Yamamura |
| 5,945,351 A | 8/1999 | Mathuni .................. 438/706 |
| 5,975,098 A | 11/1999 | Yoshitani et al. ........... 134/148 |
| 5,989,478 A | 11/1999 | Ouellette et al. |
| 5,997,653 A | 12/1999 | Yamasaka .................. 134/2 |
| 6,086,454 A | 7/2000 | Watanabe et al. ............. 451/36 |
| 6,092,937 A | 7/2000 | Snodgrass et al. ........... 396/611 |
| 6,103,636 A | 8/2000 | Zahorik et al. |
| 6,108,932 A | 8/2000 | Chai |
| 6,132,586 A | 10/2000 | Adams et al. |
| 6,214,513 B1 | 4/2001 | Cai et al. |
| 6,222,305 B1 * | 4/2001 | Beck et al. .................. 310/334 |
| 6,230,722 B1 | 5/2001 | Mitsumori et al. |
| 6,341,998 B1 | 1/2002 | Zhang |
| 6,391,166 B1 | 5/2002 | Wang |
| 6,398,975 B1 | 6/2002 | Mertens et al. ............... 216/92 |
| 6,417,117 B1 | 7/2002 | Davis |
| 6,433,541 B1 | 8/2002 | Lehman et al. |
| 6,474,786 B2 | 11/2002 | Percin et al. |
| 6,488,040 B1 | 12/2002 | De Larios et al. |
| 6,491,764 B2 | 12/2002 | Mertens et al. ............... 134/36 |
| 6,495,005 B1 | 12/2002 | Colgan et al. |
| 6,514,570 B1 | 2/2003 | Matsuyama et al. |
| 6,530,823 B1 | 3/2003 | Ahmadi et al. |
| 6,531,206 B2 | 3/2003 | Johnston et al. |
| 6,550,988 B2 | 4/2003 | Sugimoto et al. |
| 6,555,017 B1 | 4/2003 | Rushford et al. |
| 6,616,772 B2 | 9/2003 | De Larios et al. |
| 6,689,323 B2 | 2/2004 | Fisher et al. |
| 6,764,720 B2 | 7/2004 | Pui et al. |
| 6,799,584 B2 | 10/2004 | Yogev et al. |
| 6,854,473 B2 | 2/2005 | Hanson et al. |
| 6,954,993 B1 | 10/2005 | Smith et al. |
| 6,988,326 B2 | 1/2006 | O'Donnell et al. |
| 6,988,327 B2 | 1/2006 | Garcia et al. |
| 2002/0121290 A1 | 9/2002 | Tang et al. |
| 2002/0125212 A1 | 9/2002 | Mertens et al. ............... 216/57 |
| 2003/0091754 A1 | 5/2003 | Chihani et al. |
| 2003/0092264 A1 | 5/2003 | Shinji et al. |
| 2004/0060573 A1 | 4/2004 | Woods |
| 2004/0060581 A1 | 4/2004 | Garcia et al. |
| 2004/0069319 A1 | 4/2004 | Boyd et al. |
| 2004/0069326 A1 | 4/2004 | Woods et al. |
| 2004/0069329 A1 | 4/2004 | de Larios et al. |
| 2004/0136494 A1 | 7/2004 | Lof et al. |
| 2004/0178060 A1 | 9/2004 | Ravkin et al. |
| 2004/0182422 A1 | 9/2004 | Boyd et al. |
| 2005/0132515 A1 | 6/2005 | Boyd et al. |
| 2005/0139318 A1 | 6/2005 | Woods et al. |
| 2005/0145265 A1 | 7/2005 | Ravkin et al. |
| 2005/0145267 A1 | 7/2005 | Korolik et al. |
| 2005/0145268 A1 | 7/2005 | Woods |
| 2005/0148197 A1 | 7/2005 | Woods et al. |
| 2005/0217703 A1 | 10/2005 | O'Donnell |
| 2006/0064895 A1 | 3/2006 | Garcia et al. |

FOREIGN PATENT DOCUMENTS

| | | |
|---|---|---|
| EP | 0 905 747 A1 | 3/1999 |
| EP | 1 489 461 A1 | 12/2004 |
| EP | 1 489 462 A2 | 12/2004 |
| JP | 05837190 | 3/1983 |
| JP | 62150828 A | 7/1987 |
| JP | 02280330 | 11/1990 |
| JP | 02309638 | 12/1990 |
| JP | 08277486 | 10/1996 |
| JP | 11031672 | 2/1999 |
| JP | 11350169 | 12/1999 |
| JP | 2003-151948 | 5/2003 |
| WO | WO99/16109 | 4/1999 |
| WO | WO99/49504 | 9/1999 |
| WO | WO 02/01613 | 1/2002 |
| WO | WO 02/32825 A1 | 4/2002 |
| WO | WO 02/101795 A3 | 12/2002 |
| WO | WO 03/014416 A2 | 2/2003 |
| WO | WO 2004/030051 A2 | 4/2004 |

OTHER PUBLICATIONS

Lim et al., "*Atomic Layer deposition of transition metals*", Department of Chemistry and Chemical Biology, Harvard University, Nature Publishing Group, vol. 2, Nov. 2003, pp. 749-754.

ICKnowledge LLC, "*Technology Backgrounder: Atomic Layer Deposition*", ICKnowledge.com, 2004, pp. 1-7.

"*Chemical vapor deposition*", Wikipedia, the free encyclopedia http://en.wikipedia.org/wiki/Chemical_vapor_deposition, 2005, p. 1-2.

Sigma-Aldrich, "*Atomic Layer Deposition (ALD)*", http://www.sigmaaldrich.com/Area_of_interest/Chemistry/Materials_Science/Thin_Films, 2005, pp. 1-2.

J.A. Britten, "A moving-zone Marangoni drying process for critical cleaning and wet processing," Oct. 1997, *Solid State Technology*.

\* cited by examiner

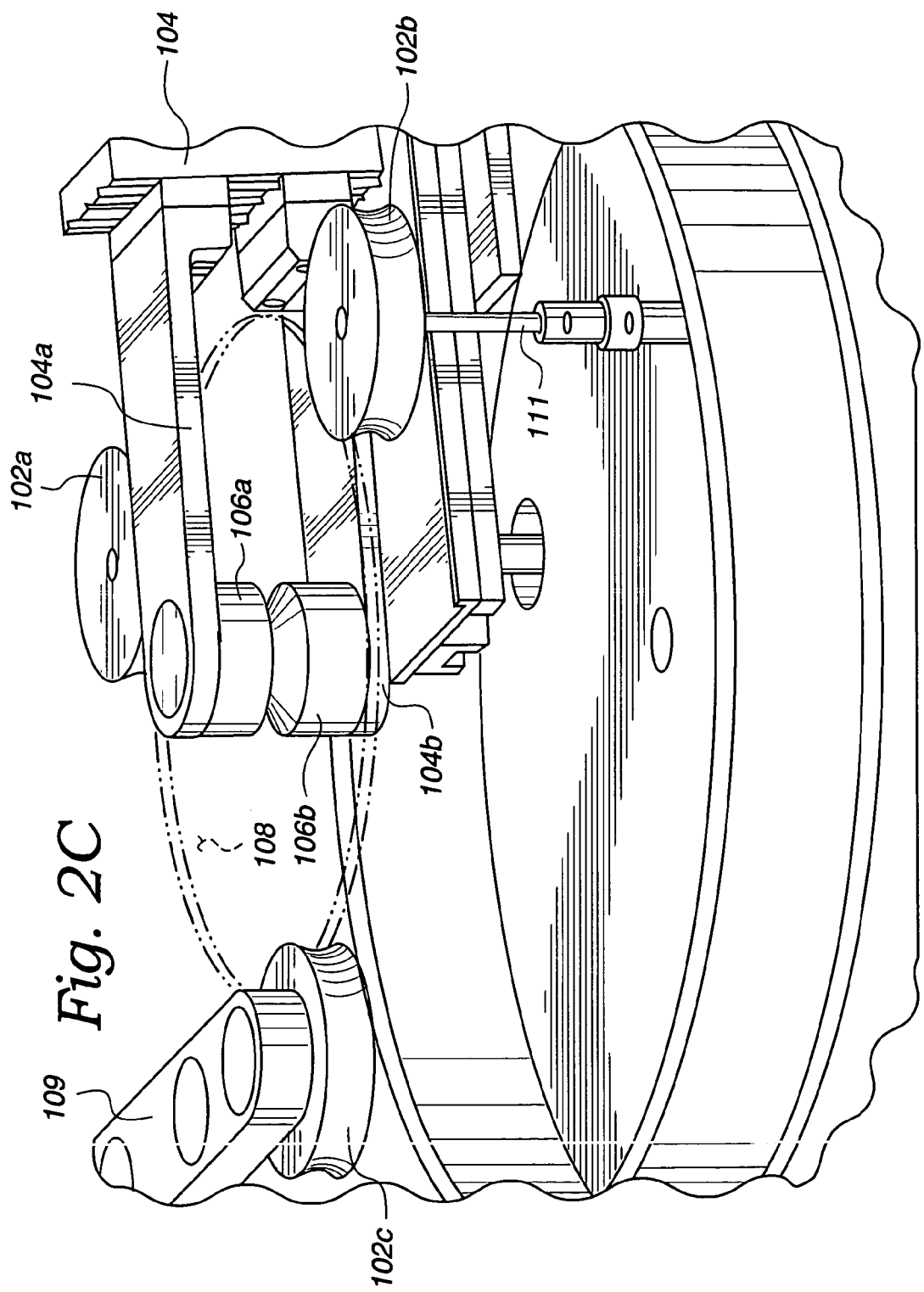

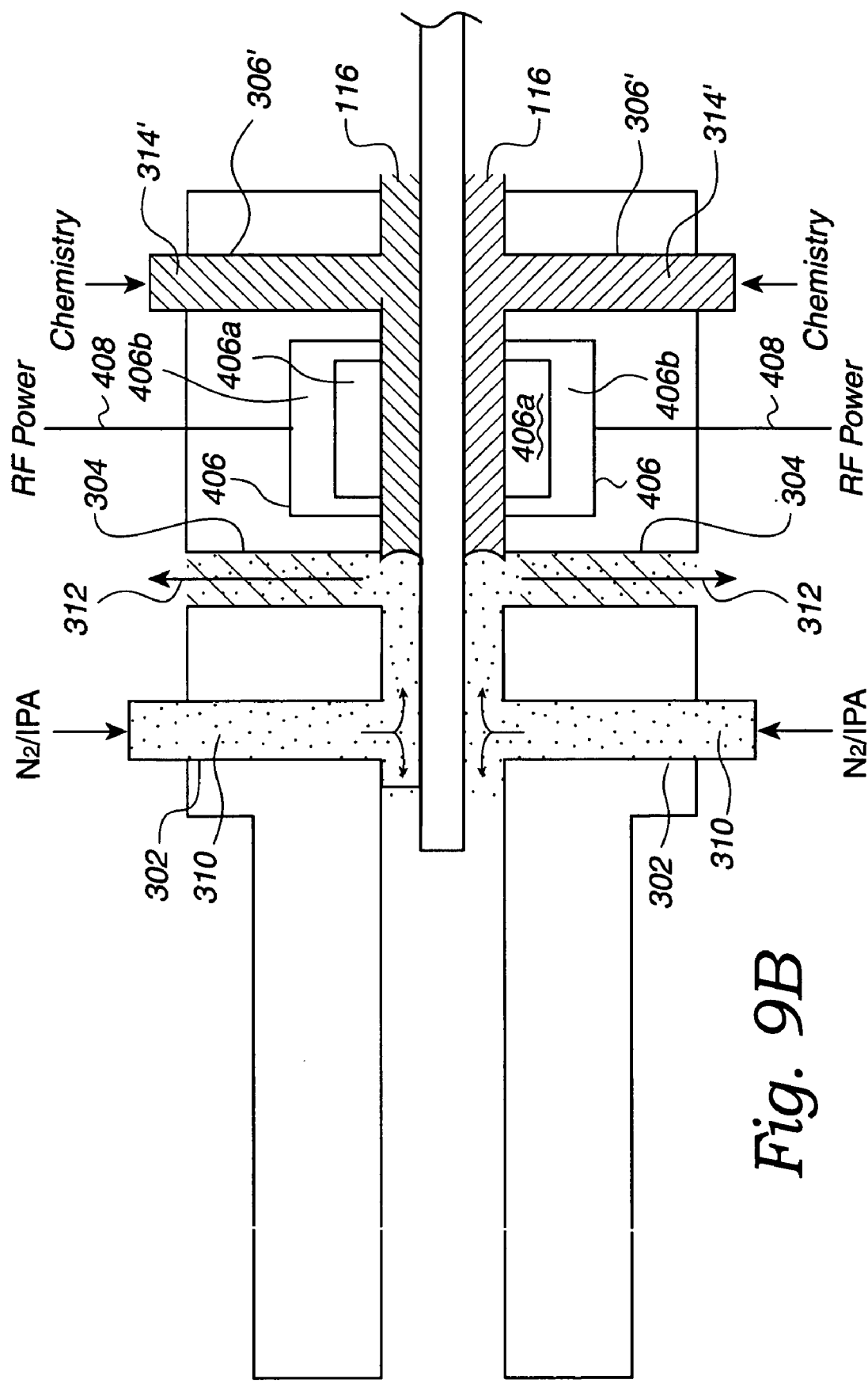

METHOD AND APPARATUS FOR CLEANING A SUBSTRATE USING MEGASONIC POWER

CROSS REFERENCE TO RELATED APPLICATION

This application is a continuation-in-part and claims priority from co-pending U.S. patent application Ser. No. 10/261,839 filed on Sep. 30, 2002 and entitled "Method and Apparatus for Drying Semiconductor Wafer Surfaces Using a Plurality of Inlets and Outlets Held in Close Proximity to the Wafer Surfaces". This application is also related to U.S. patent application Ser. No. 10/330,843 filed on Dec. 24, 2002 and entitled "Meniscus, Vacuum, IPA Vapor, Drying Manifold." This application is also related to U.S. patent application Ser. No. 10/330,897, filed on Dec. 24, 2002, entitled "System for Substrate Processing with Meniscus, Vacuum, IPA vapor, Drying Manifold" and is also related to U.S. patent application Ser. No. 10/404,270, filed on Mar. 31, 2003, entitled "Vertical Proximity Processor," and is related to U.S. patent application Ser. No. 10/404,692 filed on Mar. 31, 2003, entitled Methods and Systems for Processing a Substrate Using a Dynamic Liquid Meniscus. The aforementioned patent applications are hereby incorporated by reference in their entirety.

BACKGROUND OF THE INVENTION

1. Field of the Invention

The present invention relates to semiconductor wafer cleaning and drying and, more particularly, to apparatuses and techniques for the usage of acoustic waves in conjunction with a fluid meniscus to more efficiently clean wafer surfaces and reduce contamination during wafer processing.

2. Description of the Related Art

In the semiconductor chip fabrication process, it is well-known that there is a need to clean and dry a wafer where a fabrication operation has been performed that leaves unwanted residues on the surfaces of wafers. Examples of such a fabrication operation include plasma etching (e.g., via etch or trench etch for copper dual damascene applications) and chemical mechanical polishing (CMP). In CMP, a wafer is placed in a holder which pushes a wafer surface against a rolling conveyor belt. This conveyor belt uses a slurry which consists of chemicals and abrasive materials to cause the polishing. Unfortunately, this process tends to leave an accumulation of slurry particles and residues at the wafer surface. If left on the wafer, the unwanted residual material and particles may cause, among other things, defects such as scratches on the wafer surface and inappropriate interactions between metallization features. In some cases, such defects may cause devices on the wafer to become inoperable. In order to avoid the undue costs of discarding wafers having inoperable devices, it is therefore necessary to clean the wafer adequately yet efficiently after fabrication operations that leave unwanted residues.

The use of acoustic energy is a highly advanced, non-contact, cleaning technology for removing small-particles from substrates such as semiconductor wafers in various states of fabrication, flat panel displays, micro-electro-mechanical systems (MEMS), micro-opto-electro-mechanical systems (MOEMS), and the like. The cleaning process typically involves the propagation of acoustic energy through a liquid medium to remove particles from, and clean, a surface of a substrate. The megasonic energy is typically propagated in a frequency range of between about 600 kHz (0.6 Megahertz (MHz)) to about 1.5 MHz, inclusive. The typical liquid medium that can be utilized is deionized water or any one or more of several substrate cleaning chemicals and combinations thereof such as a dilute ammonium hydroxide/hydrogen peroxide solution in DI water. The propagation of acoustic energy through a liquid medium achieves non-contact substrate cleaning chiefly through the formation and collapse of bubbles from dissolved gases in the liquid medium, herein referred to as cavitation, microstreaming, and chemical reaction enhancement when chemicals are used as the liquid medium through improved mass transport, optimizing the zeta potential to favor particle entrainment in the liquid medium and inhibiting re-deposition, or providing activation energy to facilitate the chemical reactions.

FIG. 1A is a diagram of a typical batch substrate cleaning system 10. FIG. 1B is a top view of the batch substrate cleaning system 10. A tank 11 is filled with a cleaning solution 16 such as deionized water or other substrate cleaning chemicals. A substrate carrier 12, typically a cassette of substrates, holds a batch of substrates 14 to be cleaned. One or more transducers 18A, 18B, 18C generate the emitted acoustic energy 15 that is propagated through the cleaning solution 16. The relative location and distance between the substrates 14 and the transducers 18A, 18B and 18C are typically approximately constant from one batch of substrates 14 to another through use of locating fixtures 19A, 19B that contact and locate the carrier 12.

The emitted energy 15, with or without appropriate chemistry to control particle re-adhesion, achieves substrate cleaning through cavitation, acoustic streaming, and enhanced mass transport if cleaning chemicals are used. A batch substrate cleaning process typically requires lengthy processing times, and also can consume excessive volumes of cleaning chemicals 16. Additionally, consistency and substrate-to-substrate control are difficult to achieve.

FIG. 1C is a prior art, schematic 30 of an RF supply to supply one or more of the transducers 18A, 18B, 18C. An adjustable voltage controlled oscillator (VCO) 32 outputs a signal 33, at a selected frequency, to an RF generator 34. The RF generator 34 amplifies the signal 33 to produce a signal 35 with an increased power. The signal 35 is output to the transducer 18B. A power sensor 36 monitors the signal 35. The transducer 18B outputs emitted energy 15.

Unfortunately, the typical megasonic system has the problem of slow chemical exchange and a large effective reactor chamber volume. This can lead to contaminants being left in a megasonic reaction chamber to be redeposited on the wafer. Consequently, this can lead to inefficient cleaning and lowered wafer processing yields. Further, hot spots or cold spots in the batch cleaning system can be generated by constructive or destructive interference of the acoustic wave due to reflections from the substrates and tank walls. These hot or cold spots can either damage sensitive structures present on the substrate, or cause inefficient or non-uniform cleaning. Therefore, there is a need for a method and an apparatus that avoids the prior art by enabling quick and efficient cleaning of a semiconductor wafer, but at the same time reducing the redeposition of contaminants on the wafer following a cleaning operation while using low amounts of cleaning fluid as well as providing a uniform power density delivery to the substrate without hot or cold spots. Such deposits of contamination as often occurs today reduce the yield of acceptable wafers and increase the cost of manufacturing semiconductor wafers.

SUMMARY OF THE INVENTION

Broadly speaking, the present invention fills these needs by providing a cleaning apparatus that is capable of managing, in a controlled and effective manner, the application of megasonically enhanced cleaning chemistries to wafer surfaces. It should be appreciated that the present invention can be implemented in numerous ways, including as a process, an apparatus, a system, a device or a method. Several inventive embodiments of the present invention are described below.

In one embodiment, a method for processing a substrate is provided that includes generating a fluid meniscus on a surface of the substrate and applying acoustic energy to the fluid meniscus. The method also includes moving the fluid meniscus over the surface the substrate to process the surface of the substrate.

In another embodiment, a head used in a substrate preparation apparatus is provided. The head includes at least one of a first source inlet for delivering a first fluid to the surface of the substrate through the head, and at least one of a second source inlet for delivering a second fluid to the surface of the substrate through the head, the second fluid being different than the first fluid. The head also includes at least one of a source outlet for removing each of the first fluid and the second fluid from the surface of the substrate where at least a portion of the at least one of the source outlet is located in between the at least one of the first source inlet and the at least one of the second source inlet. The at least one of the first source inlet, the at least one of the second source inlet, and the at least one of the source outlet act substantially simultaneously when in operation. The head also includes a transducer being capable of applying acoustic energy to the first fluid. The at least one of the second source inlet surrounds at least a trailing edge side of the at least one of the source outlet.

In yet another embodiment, a manifold for use in preparing a wafer surface is provided. The manifold includes a cleaning region in a first portion of the manifold being configured generate a first fluid meniscus on the wafer surface. The manifold also includes a transducer being defined within the cleaning region capable of applying acoustic energy to the first fluid meniscus. The head also includes a drying region in a second portion of the manifold being configured to generate a second fluid meniscus on the wafer surface.

The advantages of the present invention are numerous. Most notably, the apparatuses and methods described herein can effectively and efficiently clean a semiconductor wafer while reducing fluids and contaminants remaining on a wafer surface. Consequently, wafer processing and production may be increased and higher wafer yields may be achieved due to efficient wafer cleaning with lower levels of contamination. The present invention enables the improved cleaning through the use of vacuum fluid removal in conjunction with fluid input and megasonic application. The pressures generated on a wafer surface by the aforementioned forces enable optimal removal of contaminants at the wafer surface with a significant reduction in the redepositing of contamination as compared with other cleaning techniques. The present invention may utilize application of an isopropyl alcohol (IPA) vapor and cleaning chemistries towards a wafer surface along with generation of a vacuum near the wafer surface at substantially the same time. This enables both the generation and intelligent control of a meniscus and the reduction of water surface tension along a cleaning chemistry interface and therefore enables optimal removal of fluids from the wafer surface without leaving contaminants. At a substantially same time, megasonic waves may be applied to the meniscus to provide megasonic based wafer cleaning without the problems of typical megasonic applications. In addition, the cleaning meniscus generated by input of IPA, cleaning chemistries and output of fluids may be moved along the surface of the wafer to clean the wafer. Moreover, in an additional embodiment, the apparatus and methods described herein may both clean and dry the wafer while at the same time reducing contamination left on the wafer surfaces as compared with prior art cleaning and drying systems. Therefore, the present invention cleans wafer surfaces with extreme effectiveness while substantially reducing contaminant formation.

Other aspects and advantages of the present invention will become apparent from the following detailed description, taken in conjunction with the accompanying drawings, illustrating by way of example the principles of the present invention.

BRIEF DESCRIPTION OF THE DRAWINGS

The present invention will be readily understood by the following detailed description in conjunction with the accompanying drawings. To facilitate this description, like reference numerals designate like structural elements.

FIG. 1C is a prior art, schematic of an RF supply to supply one or more of the transducers.

FIG. 2C illustrates a side close-up view of the wafer cleaning and drying system holding a wafer in accordance with one embodiment of the present invention.

FIG. 9B illustrates a side view of the proximity heads for use in a dual wafer surface megasonic cleaning system in accordance with one embodiment of the present invention.

DETAILED DESCRIPTION OF THE PREFERRED EMBODIMENTS

An invention for methods and apparatuses for cleaning and/or drying a wafer is disclosed. In the following description, numerous specific details are set forth in order to provide a thorough understanding of the present invention. It will be understood, however, by one of ordinary skill in the art, that the present invention may be practiced without some or all of these specific details. In other instances, well known process operations have not been described in detail in order not to unnecessarily obscure the present invention.

While this invention has been described in terms of several preferred embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

FIGS. 2A through 2D below illustrate embodiments of an exemplary wafer processing system. It should be appreciated that the system is exemplary, and that any other suitable type of configuration that would enable movement of the proximity head(s) into close proximity to the wafer may be utilized. In the embodiments shown, the proximity head(s) may move in a linear fashion from a center portion of the wafer to the edge of the wafer. It should be appreciated that other embodiments may be utilized where the proximity head(s) move in a linear fashion from one edge of the wafer to another diametrically opposite edge of the wafer, or other non-linear movements may be utilized such as, for example, in a radial motion, in a circular motion, in a spiral motion, in a zig-zag motion, etc. The motion may also be any suitable specified motion profile as desired by a user. In addition, in one embodiment, the wafer may be rotated and the proximity head moved in a linear fashion so the proximity head may process all portions of the wafer. It should also be understood that other embodiments may be utilized where the wafer is not rotated but the proximity head is configured to move over the wafer in a fashion that enables processing of all portions of the wafer. In addition, the proximity head and the wafer cleaning and drying system described herein may be utilized to clean and dry any shape and size of substrates such as for example, 200 mm wafers, 300 mm wafers, flat panels, etc. The wafer cleaning and drying system may be utilized for either or both cleaning and drying the wafer depending on the configuration of the system.

Figure 1B:
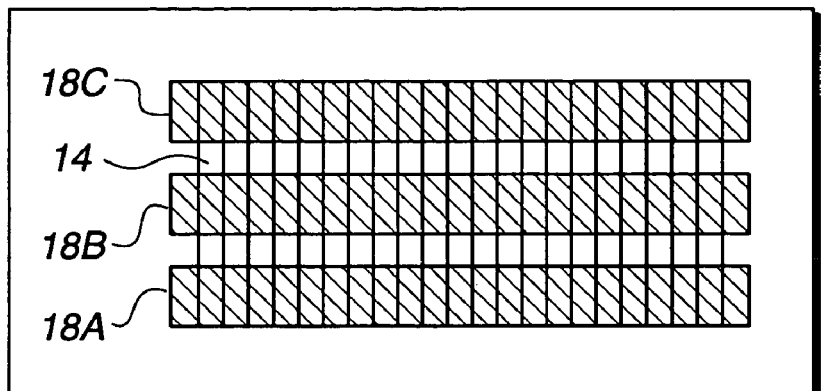
FIG. 1B is a top view of the batch substrate cleaning system.
Figure 1A:
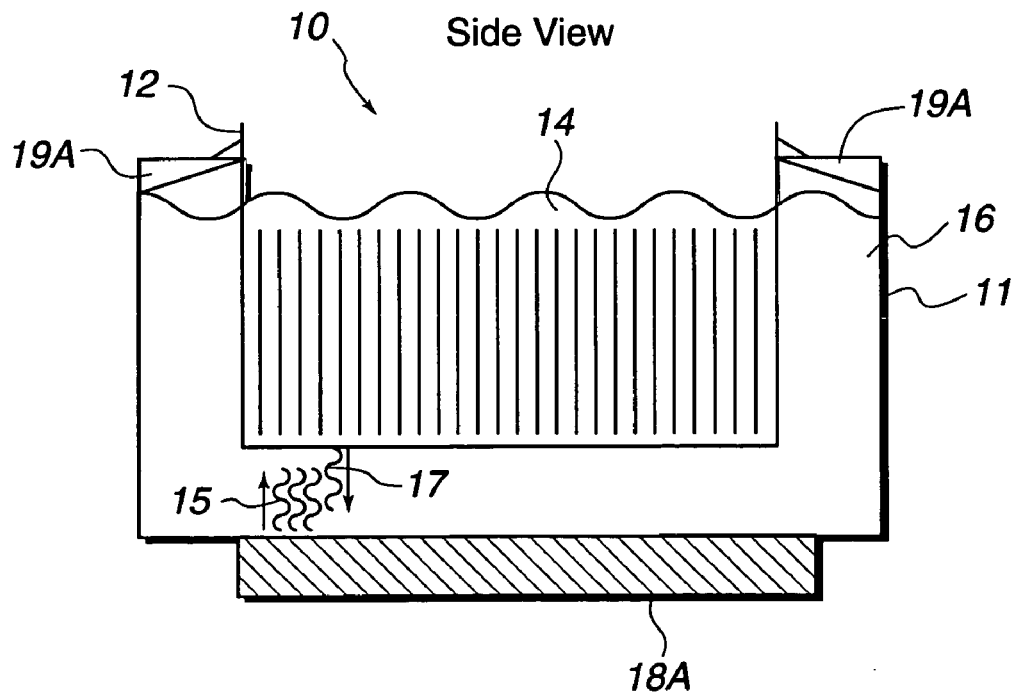
FIG. 1A is a diagram of a typical batch substrate cleaning system.
Figure 2A:
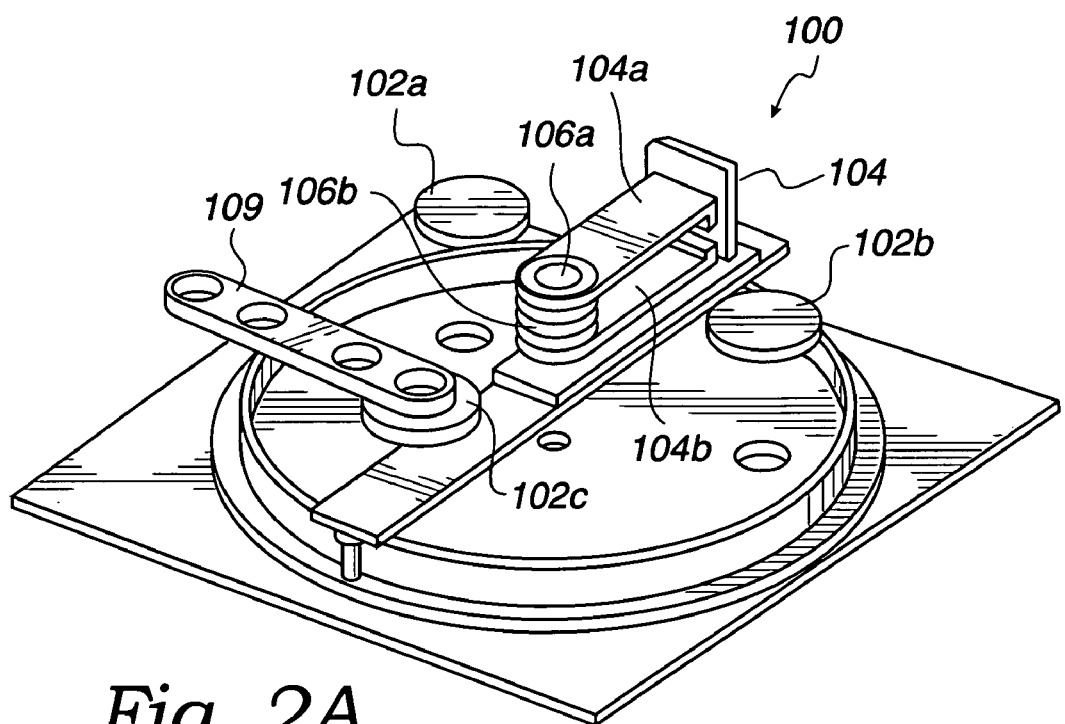
FIG. 2A shows a wafer cleaning and drying system in accordance with one embodiment of the present invention.

FIG. 2A shows a wafer cleaning and drying system 100 in accordance with one embodiment of the present invention. The system 100 includes rollers 102a, 102b, and 102c which may hold and rotate a wafer to enable wafer surfaces to be dried. The system 100 also includes proximity heads 106a and 106b that, in one embodiment, are attached to an upper arm 104a and to a lower arm 104b respectively. The upper arm 104a and the lower arm 104b are part of a proximity head carrier assembly 104 which enables substantially linear movement of the proximity heads 106a and 106b along a radius of the wafer.

In one embodiment the proximity head carrier assembly 104 is configured to hold the proximity head 106a above the wafer and the proximity head 106b below the wafer in close proximity to the wafer. This may be accomplished by having the upper arm 104a and the lower arm 104b be movable in a vertical manner so once the proximity heads are moved horizontally into a location to start wafer processing, the proximity heads 106a and 106b can be moved vertically to a position in close proximity to the wafer. The upper arm 104a and the lower arm 104b may be configured in any suitable way so the proximity heads 106a and 106b can be moved to enable wafer processing as described herein. It should be appreciated that the system 100 may be configured in any suitable manner as long as the proximity head(s) may be moved in close proximity to the wafer to generate and control a meniscus as discussed below in reference to FIGS. 6D through 8B. It should also be understood that close proximity may be any suitable distance from the wafer as long as a meniscus as discussed in further reference to FIGS. 6D through 8B may be maintained. In one embodiment, the proximity heads 106a and 106b (as well as any other proximity head described herein) may each be moved to between about 0.1 mm to about 10 mm from the wafer to initiate wafer processing operations. In a preferable embodiment, the proximity heads 106a and 106b (as well as any other proximity head described herein) may each be moved to between about 0.5 mm to about 4.5 mm from the wafer to initiate wafer processing operations, and in more preferable embodiment, the proximity heads 106a and 106b (as well as any other proximity head described herein) may be moved to about 2 mm from the wafer to initiate wafer processing operations.

Figure 2B:
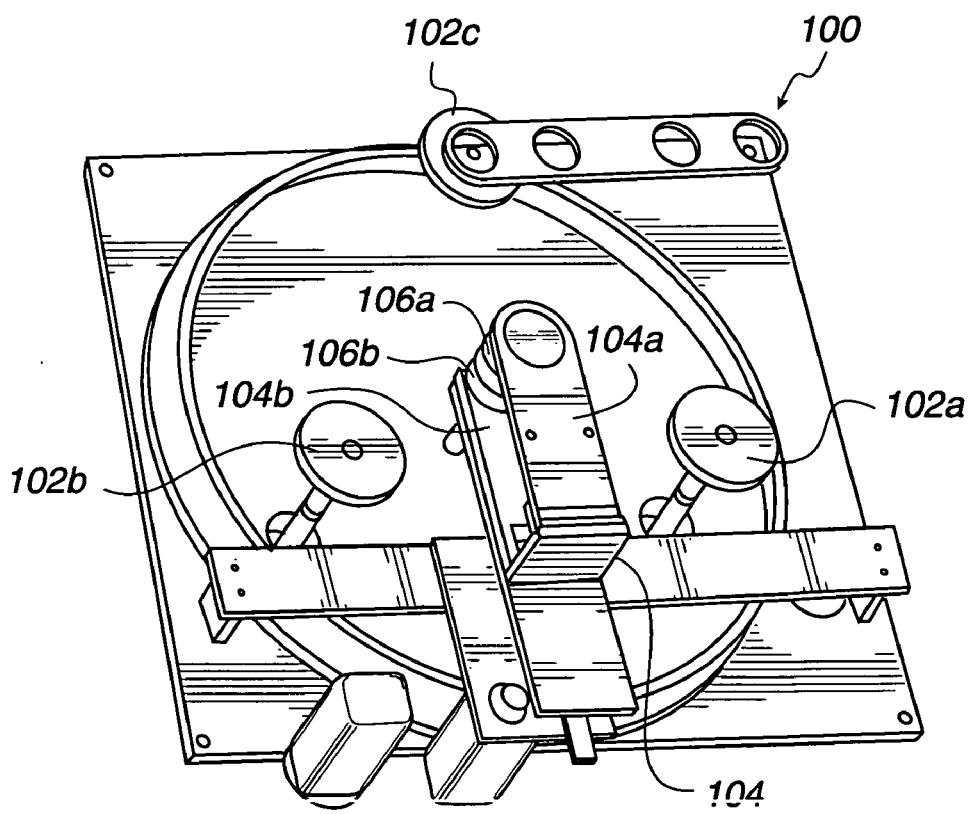
FIG. 2B shows an alternate view of the wafer cleaning and drying system in accordance with one embodiment of present invention.

FIG. 2B shows an alternate view of the wafer cleaning and drying system 100 in accordance with one embodiment of present invention. The system 100, in one embodiment, has the proximity head carrier assembly 104 that is configured to enable the proximity heads 106a and 106b to be moved from the center of the wafer towards the edge of the wafer. It should be appreciated that the proximity head carrier assembly 104 may be movable in any suitable manner that would enable movement of the proximity heads 106a and 106b to clean and/or dry the wafer as desired. In one embodiment, the proximity head carrier assembly 104 can be motorized to move the proximity head 106a and 106b from the center of the wafer to the edge of the wafer. It should be understood that although the wafer cleaning and drying system 100 is shown with the proximity heads 106a and 106b, that any suitable number of proximity heads may be utilized such as, for example, 1, 2, 3, 4, 5, 6, etc. The proximity heads 106a and/or 106b of the wafer cleaning and drying system 100 may also be any suitable size or shape as shown by, for example, any of the proximity heads as described herein. The different configurations described herein generate a fluid meniscus between the proximity head and the wafer. The fluid meniscus may be moved across the wafer to clean and dry the wafer by applying fluid to the wafer surface and removing the fluids from the surface. Therefore, the proximity heads 106a and 106b can have any numerous types of configurations as shown herein or other configurations that enable the processes described herein. It should also be appreciated that the system 100 may clean and dry one surface of the wafer or both the top surface and the bottom surface of the wafer.

In addition, besides cleaning or drying both the top and bottom surfaces and of the wafer, the system 100 may also be configured to clean one side of the wafer and dry another side of the wafer if desired by inputting and outputting different types of fluids. It should be appreciated that the system 100 may utilize the application of different cleaning chemicals and/or drying chemicals to the top and bottom in the proximity heads 106a and 106b respectively depending on the operation desired. In one embodiment, when a drying operation is conducted, DIW may be applied to the wafer surface. In another embodiment, the heads 106a and/or 106b may include a megasonic transducer connected to a RF supply. The megasonic transducer may be defined within the heads 106a and/or 106b so as to be capable of applying acoustic energy to the meniscus generated by the heads 106a and/or 106b. In such an embodiment, the RF supply may direct energy into the transducer which may emit acoustic energy directly to the wafer by coupling through the meniscus thereby generating megasonic cleaning power.

In a cleaning operation, cleaning chemistries may be any suitable type of cleaning chemistries used by those skilled in the art that does not degrade the components utilized. Exemplary cleaning chemistries that may be used are SC-1 (DI water/hydrogen peroxide, ammonium hydroxide, proprietary chemistries available from chemical suppliers such as ESC, EKC (CuSolve5800), Ashland (NE89, NE3000), ATMI (ST250, ST255), DIW/HCl/H2O2, DIW/H2SO4/H2O2, DIW/HF, DIW/HF/H2O2. The proximity heads can be configured to clean and dry the bevel edge of the wafer in addition to cleaning and/or drying the top and/or bottom of the wafer. This can be accomplished by moving the megasonic enhanced meniscus off the edge the wafer which cleans the bevel edge. It should also be understood that the proximity heads 106a and 106b may be the same type of apparatus or different types of proximity heads.

FIG. 2C illustrates a side close-up view of the wafer cleaning and drying system 100 holding a wafer 108 in accordance with one embodiment of the present invention. The wafer 108 may be held and rotated by the rollers 102a, 102b, and 102c in any suitable orientation as long as the orientation enables a desired proximity head to be in close proximity to a portion of the wafer 108 that is to be cleaned or dried. In one embodiment, the roller 102b may be rotated by using a spindle 111, and the roller 102c may held and rotated by a roller arm 109. The roller 102a may also be rotated by its own spindle (as shown in FIG. 3B. In one embodiment, the rollers 102a, 102b, and 102c can rotate in a clockwise direction to rotate the wafer 108 in a counterclockwise direction. It should be understood that the rollers may be rotated in either a clockwise or a counterclockwise direction depending on the wafer rotation desired. In one embodiment, the rotation imparted on the wafer 108 by the rollers 102a, 102b, and 102c serves to move a wafer area that has not been processed into close proximity to the proximity heads 106a and 106b. However, the rotation itself does not dry the wafer or move fluid on the wafer surfaces towards the edge of the wafer. Therefore, in an exemplary cleaning operation, the unclean areas of the wafer would be presented to the proximity heads 106a and 106b through both the linear motion of the proximity heads 106a and 106b and through the rotation of the wafer 108. The cleaning operation itself is conducted by at least one of the proximity heads. Consequently, in one embodiment, a clean area of the wafer 108 would expand from a center region to the edge region of the wafer 108 in a spiral movement as a cleaning operation progresses. In a preferable embodiment, the size of the heads 106a and 106b may be large enough that the clean area of the wafer 108 would move around the wafer 108 in a circular manner and the wafer 108 would be dry in one rotation (if the length of the proximity heads 106a and 106b are at least a radius of the wafer 108) By changing the configuration of the system 100 and the orientation of and movement of the proximity head 106a and/or the proximity head 106b, the cleaning movement may be changed to accommodate nearly any suitable type of cleaning path.

It should be understood that the proximity heads 106a and 106b may be configured to have at least one of first source inlet (which may be called a liquid inlet) configured to input a fluid (which may be a cleaning chemistry or DIW), at least one of a second source inlet configured to input $N_2$ carrier gas containing isopropyl alcohol (IPA) in vapor form (also known as IPA inlet), and at least one source outlet configured to output fluids from a region between the wafer and a particular proximity head by applying vacuum (also known as vacuum outlet). It should be appreciated that the vacuum utilized herein may also be suction. In addition, other types of solutions may be inputted into the first source inlet and the second source inlet such as, for example, cleaning solutions, ammonia, HF, etc. It should be appreciated that although IPA vapor is used in some of the exemplary embodiments, any other type of vapor may be utilized such as for example, nitrogen, any suitable alcohol vapor, organic compounds, etc. that may be miscible with water.

In one embodiment, the at least one $N_2$/IPA vapor inlet is adjacent to the at least one vacuum outlet which is in turn adjacent to the at least one DIW/cleaning chemistry inlet to form an IPA-vacuum-liquid orientation. It should be appreciated that other types of orientations such as IPA-liquid-vacuum, liquid-vacuum-IPA, vacuum-IPA-liquid, etc. may be utilized depending on the wafer processes desired and what type of wafer cleaning and drying mechanism is sought to be enhanced. In one embodiment, the IPA-vacuum-liquid orientation may be utilized to intelligently and powerfully generate, control, and move the meniscus located between a proximity head and a wafer to clean and dry wafers. In a preferable embodiment, a megasonic transducer may be defined in a location between the vacuum outlet and the liquid inlet. In such an embodiment, an orientation such as IPA-vacuum-megasonic-liquid orientation may be utilized. The liquid inlets, the $N_2$/IPA vapor inlets, the vacuum outlets, and the megasonic transducer may be arranged in any suitable manner if the above orientations are maintained. For example, in addition to the $N_2$/IPA vapor inlet, the vacuum outlet, the megasonic transducer, and the liquid inlet, in an additional embodiment, there may be additional sets of IPA vapor outlets, liquid inlets and/or vacuum outlets depending on the configuration of the proximity head desired. Therefore, another embodiment may utilize an IPA-vacuum-megasonic-liquid-liquid-vacuum-IPA or other exemplary embodiments with an IPA source inlet, vacuum source outlet, megasonic transducer, and liquid source inlet configurations are described herein. It should be appreciated that the exact configuration of the IPA-vacuum-megasonic-liquid orientation may be varied depending on the application. For example, the distance between the IPA input, vacuum, megasonic, and liquid input locations may be varied so the distances are consistent or so the distances are inconsistent. In addition, the distances between the IPA input, vacuum, megasonic, and liquid input may differ in magnitude depending on the size, shape, and configuration of the proximity head 106a and the desired size of a process window (i.e., meniscus shape and size).

Figure 2D:
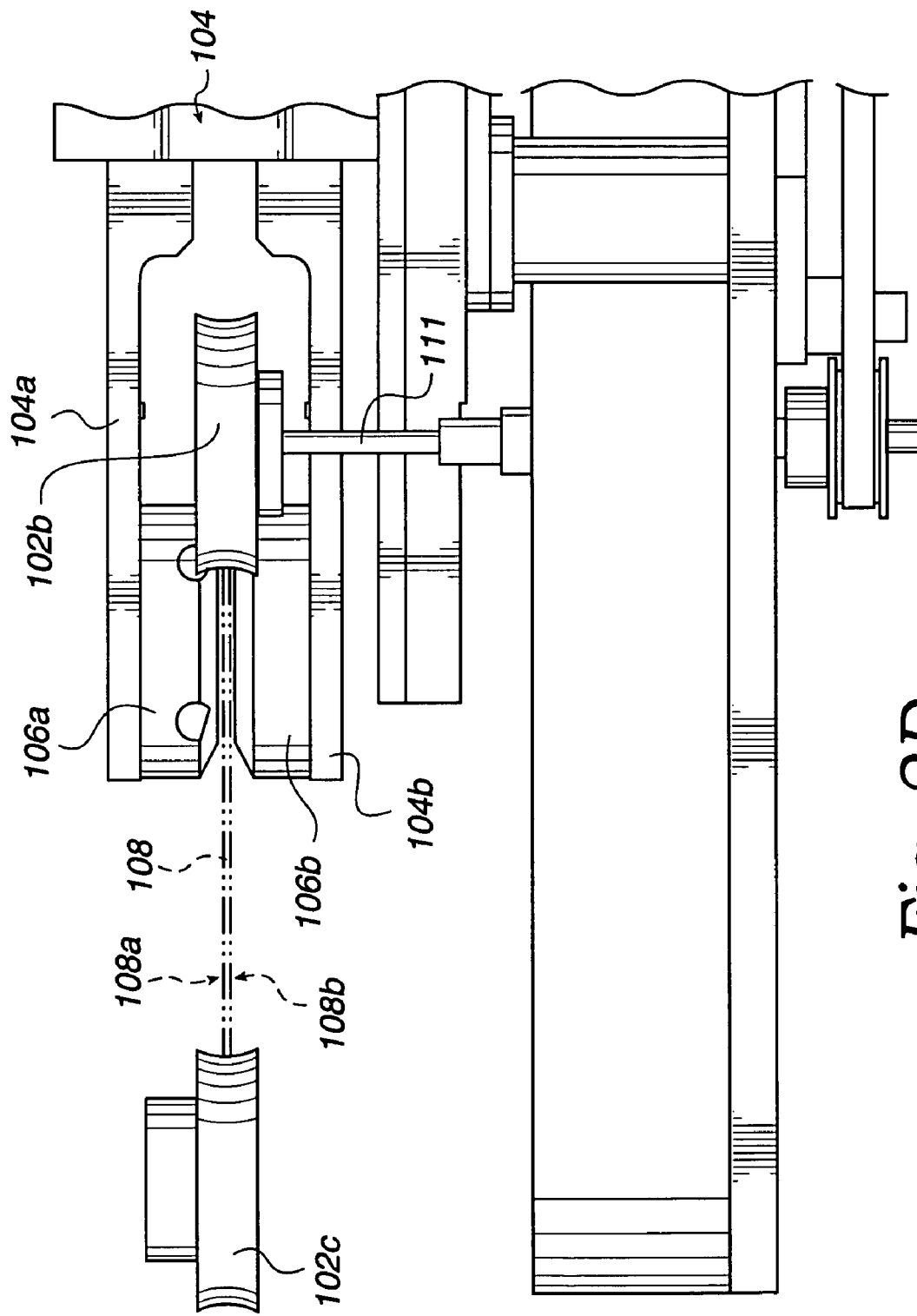
FIG. 2D shows another side close-up view of the wafer cleaning and drying system in accordance with one embodiment of the present invention.

FIG. 2D shows another side close-up view of the wafer cleaning and drying system 100 in accordance with one embodiment of the present invention. In this embodiment, the proximity heads 106a and 106b have been positioned in close proximity to a top surface 108a and a bottom surface 108b of the wafer 108 respectively by utilization of the proximity head carrier assembly 104. Once in this position, the proximity heads 106a and 106b may utilize the IPA and liquid source inlets and a vacuum source outlet(s) to generate wafer processing meniscuses in contact with the wafer 108 which are capable of removing fluids from a top surface 108a and a bottom surface 108b. The wafer processing meniscus may be generated in accordance with the descriptions in reference to FIGS. 6 through 9B where IPA vapor and cleaning chemistries are inputted into the region between the wafer 108 and the proximity heads 106a and 106b. At substantially the same time the IPA and cleaning chemistry is inputted, a vacuum may be applied in close proximity to the wafer surface to output the IPA vapor, the cleaning chemistry, and the fluids that may be on a wafer surface. It should be appreciated that although IPA is utilized in the exemplary embodiment, any other suitable type of vapor may be utilized such as for example, nitrogen, any suitable alcohol vapor, organic compounds, hexanol, ethyl glycol, etc. that may be miscible with water. These fluids may also be known as surface tension reducing fluids. The portion of the cleaning chemistry that is in the region between the proximity head and the wafer is the meniscus. It should be appreciated that as used herein, the term "output" can refer to the removal of fluid from a region between the wafer 108 and a particular proximity head, and the term "input" can be the introduction of fluid to the region between the wafer 108 and the particular proximity head.

In another exemplary embodiment, the proximity heads 106a and 106b may be moved in a manner so all parts of the wafer 108 are cleaned, dried, or both without the wafer 108 being rotated. In such an embodiment, the proximity head carrier assembly 104 may be configured to enable movement of the either one or both of the proximity heads 106a and 106b to close proximity of any suitable region of the wafer 108. In one embodiment, of the proximity heads are smaller in length than a radius of the wafer, the proximity heads may be configured to move in a spiral manner from the center to the edge of the wafer 108 or vice versa. In a preferable embodiment, when the proximity heads are larger in length than a radius of the wafer, the proximity heads 106a and 106b may be moved over the entire surface of the wafer in one rotation. In another embodiment, the proximity heads 104a and 104b may be configured to move in a linear fashion back and forth across the wafer 108 so all parts of the wafer surfaces 108a and/or 108b may be processed. In yet another embodiment, configurations as discussed below in reference to FIGS. 5C through 5H may be utilized.

Consequently, countless different configurations of the system 100 may be utilized in order to obtain an optimization of the wafer processing operation.

Figure 3A:
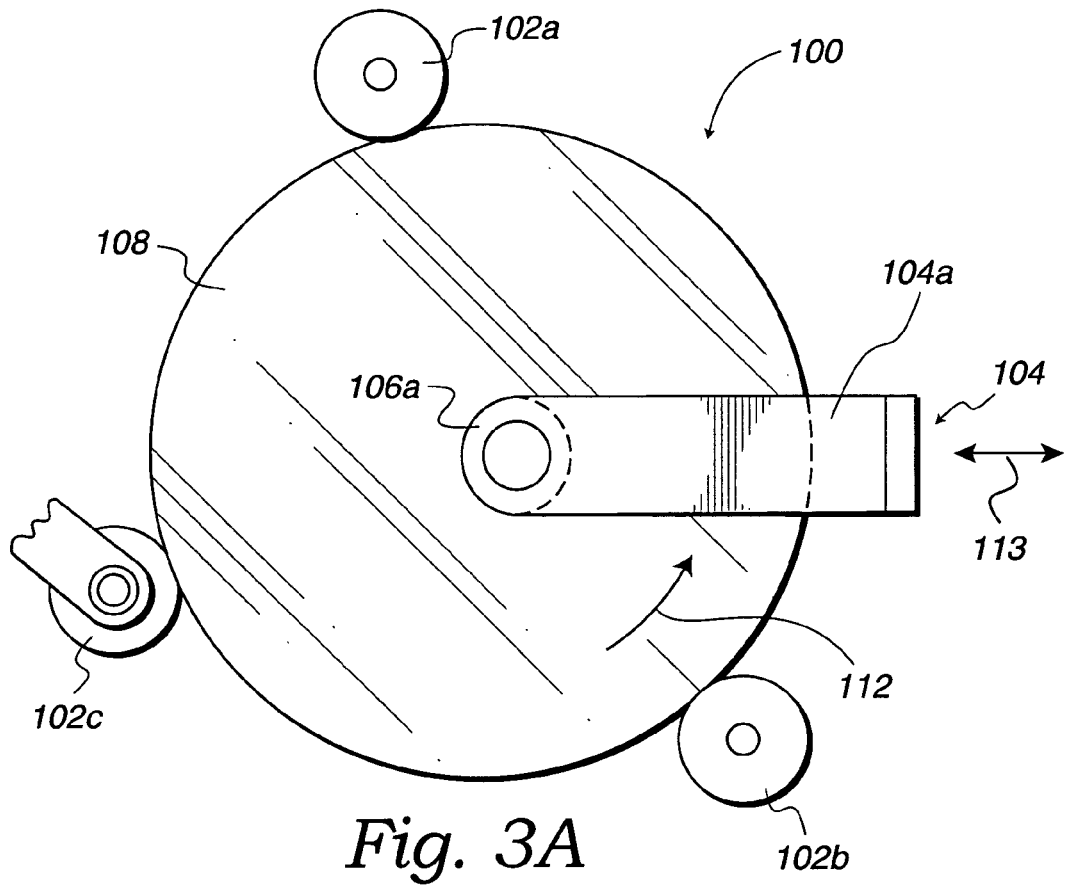
FIG. 3A shows a top view illustrating the wafer cleaning and drying system with dual proximity heads in accordance with one embodiment of the present invention.
Figure 3B:
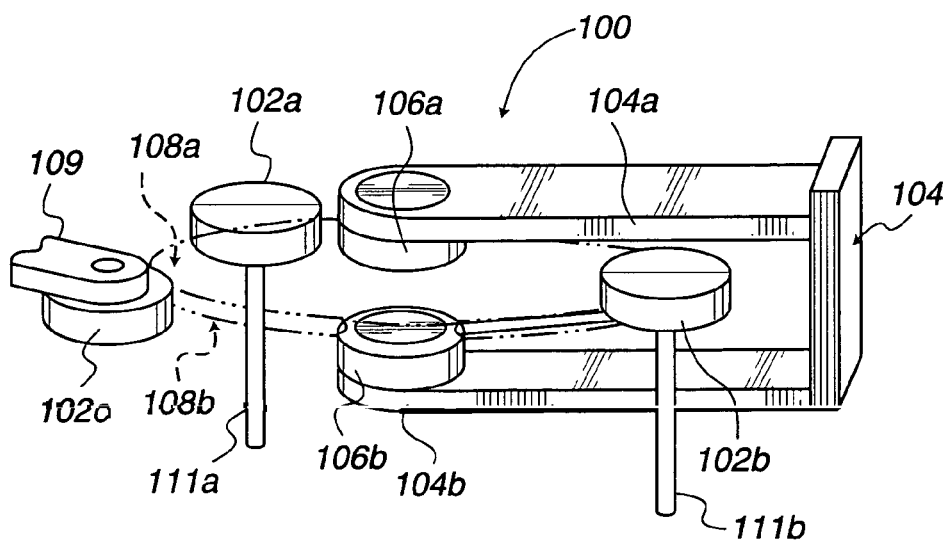
FIG. 3B illustrates a side view of the wafer cleaning and drying system with dual proximity heads in accordance with one embodiment of the present invention.

FIG. 3A shows a top view illustrating the wafer cleaning and drying system 100 with dual proximity heads in accordance with one embodiment of the present invention. As described above in reference to FIGS. 2A to 2D, the upper arm 104a may be configured to move and hold the proximity head 106a in a position in close proximity over the wafer 108. The upper arm 104a may also be configured to move the proximity head 106a from a center portion of the wafer 108 towards the edge of the wafer 108 in a substantially linear fashion 113. Consequently, in one embodiment, as the wafer 108 moves as shown by rotation 112, the proximity head 106a is capable of cleaning a top surface 108a of the wafer 108. Therefore, the proximity head 106a may clean the wafer 108 in a substantially spiral path over the wafer 108. In another embodiment as shown in reference to FIG. 3B, there may be a second proximity head located below the wafer 108 to clean the bottom surface 108b of the wafer 108.

FIG. 3B illustrates a side view of the wafer cleaning and drying system 100 with dual proximity heads in accordance with one embodiment of the present invention. In this embodiment, the system 100 includes both the proximity head 106a capable of processing a top surface of the wafer 108 and the proximity head 106b capable of processing a bottom surface of the wafer 108. In one embodiment, spindles 111a and 111b along with a roller arm 109 may rotate the rollers 102a, 102b, and 102c respectively. This rotation of the rollers 102a, 102b, and 102c may rotate the wafer 108 so substantially all surfaces of the wafer 108 may be presented to the proximity heads 106a and 106b for drying and/or cleaning. In one embodiment, while the wafer 108 is being rotated, the proximity heads 106a and 106b are brought to close proximity of the wafer surfaces 108a and 108b by the arms 104a and 104b respectively. Once the proximity heads 106a and 106b are brought into close proximity to the wafer 108, the wafer drying and/or cleaning may be begun. In operation, the proximity heads 106a and 106b may each apply cleaning chemistry/DIW from the wafer 108 by applying IPA, cleaning chemistry, and vacuum to the top surface and the bottom surface of the wafer 108.

In one embodiment, by using the proximity heads 106a and 106b, the system 100 may clean/dry a 200 mm wafer in less than 45 seconds. In another embodiment, where the proximity heads 106a and 106b are at least a radius of the wafer in length, the cleaning/drying time for a wafer may be less than 30 seconds. It should be understood that drying and/or cleaning time may be decreased by increasing the speed at which the proximity heads 106a and 106b travels from the center of the wafer 108 to the edge of the wafer 108. In another embodiment, the proximity heads 106a and 106b may be utilized with a faster wafer rotation to dry the wafer 108 in less time. In yet another embodiment, the rotation of the wafer 108 and the movement of the proximity heads 106a and 106b may be adjusted in conjunction to obtain an optimal drying/cleaning speed. In one embodiment, the proximity heads 106a and 106b may move linearly from a center region of the wafer 108 to the edge of the wafer 108 at between about 0 mm per second to about 50 mm per second.

Figure 4A:
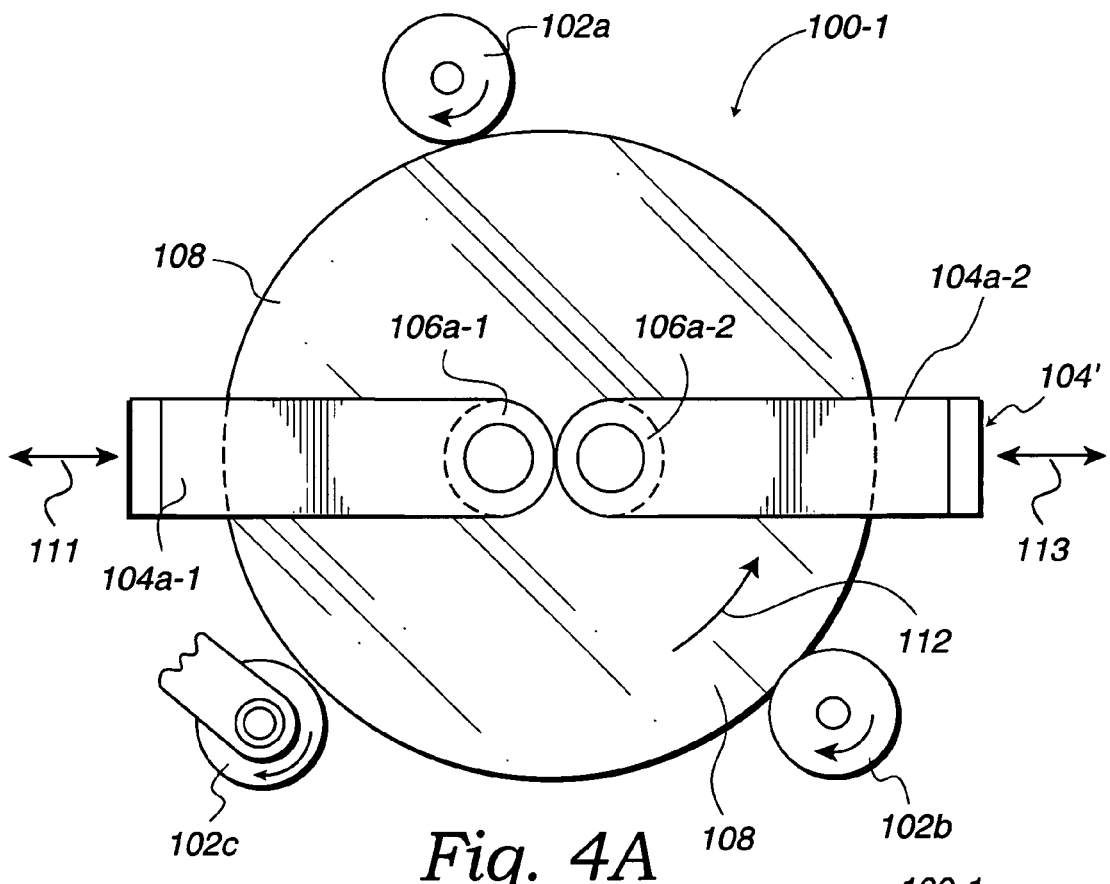
FIG. 4A shows a top view of a wafer cleaning and drying system which includes multiple proximity heads for a particular surface of the wafer in accordance with one embodiment of the present invention.
Figure 4B:
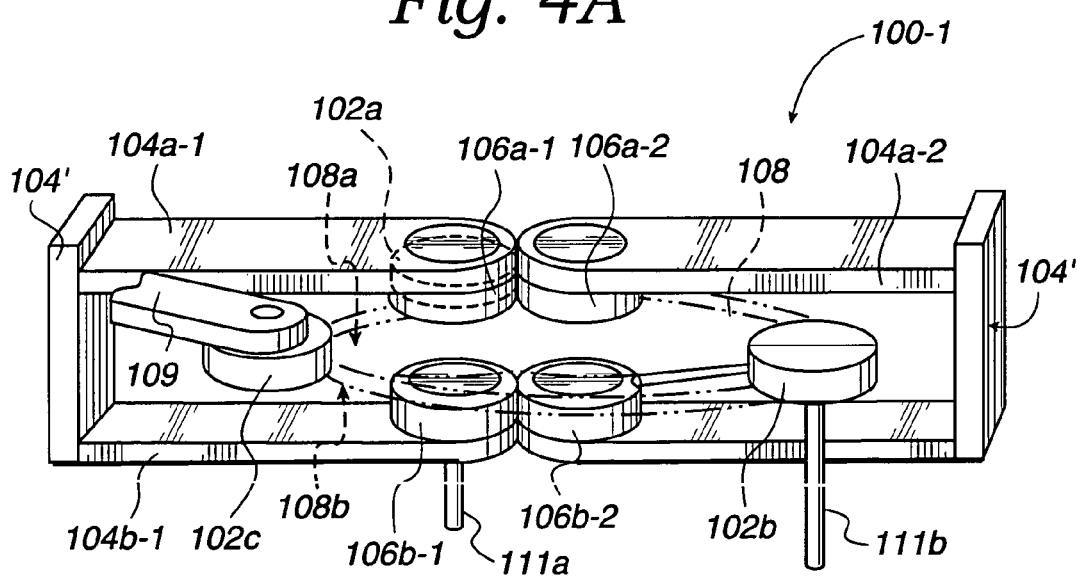
FIG. 4B shows a side view of the wafer cleaning and drying system which includes multiple proximity heads for a particular surface of the wafer in accordance with one embodiment of the present invention.

FIG. 4A shows a top view of a wafer cleaning and drying system 100-1 which includes multiple proximity heads for a particular surface of the wafer 108 in accordance with one embodiment of the present invention. In this embodiment, the system 100-1 includes an upper arm 104a-1 and an upper arm 104a-2. As shown in FIG. 4B, the system 100-1 also may include lower arm 104b-1 and lower arm 104b-2 connected to proximity heads 106b-1 and 106b-2 respectively. In the system 100-1, the proximity heads 106a-1 and 106a-2 (as well as 106b-1 and 106b-2 if top and bottom surface processing is being conducted) work in conjunction so, by having two proximity heads processing a particular surface of the wafer 108, drying time or cleaning time may be cut to about half of the time. Therefore, in operation, while the wafer 108 is rotated, the proximity heads 106a-1, 106a-2, 106b-1, and 106b-2 start processing the wafer 108 near the center of the wafer 108 and move outward toward the edge of the wafer 108 in a substantially linear fashion. In this way, as the rotation 112 of the wafer 108 brings all regions of the wafer 108 in proximity with the proximity heads so as to process all parts of the wafer 108. Therefore, with the linear movement of the proximity heads 106a-1, 106a-2, 106b-1, and 106b-2 and the rotational movement of the wafer 108, the wafer surface being dried moves in a spiral fashion from the center of the wafer 108 to the edge of the wafer 108.

In another embodiment, the proximity heads 106a-1 and 106b-1 may start processing the wafer 108 and after they have moved away from the center region of the wafer 108, the proximity heads 106a-2 and 106b-2 may be moved into place in the center region of the wafer 108 to augment in wafer processing operations. Therefore, the wafer processing time may be decreased significantly by using multiple proximity heads to process a particular wafer surface.

FIG. 4B shows a side view of the wafer cleaning and drying system 100-1 which includes multiple proximity heads for a particular surface of the wafer 108 in accordance with one embodiment of the present invention. In this embodiment, the system 100-1 includes both the proximity heads 106a-1 and 106a-2 that are capable of processing the top surface 108a of the wafer 108, and proximity heads 106b-1 and 106b-2 capable of processing the bottom surface 108b of the wafer 108. As in the system 100, the spindles 111a and 111b along with a roller arm 109 may rotate the rollers 102a, 102b, and 102c respectively. This rotation of the rollers 102a, 102b, and 102c may rotate the wafer 108 so substantially all surfaces of the wafer 108 may brought in close proximity to the proximity heads 106a-1, 106a-2, 106b-1, and 106b-2 for wafer processing operations.

In operation, each of the proximity heads 106a-1, 106a-2, 106b-1, and 106b-2 may clean the top and bottom surfaces of the wafer 108 by applying IPA, cleaning chemistry (or DIW in a drying operation) and vacuum to the top surface and the bottom surface of the wafer 108 as shown, for example, in FIGS. 6 through 8. By having two proximity heads per wafer side, the wafer processing operation (i.e., cleaning and/or drying) may be accomplished in substantially less time. It should be appreciated that as with the wafer processing system described in reference to FIGS. 3A and 3B, the speed of the wafer rotation may be varied to any suitable speed as long as the configuration enables proper wafer processing. In one embodiment, the wafer processing time may be decreased when half a rotation of the wafer 108 is used to dry the entire wafer. In such an embodiment, the wafer processing speed may be about half of the processing speed when only one proximity head is utilized per wafer side.

Figure 5A:
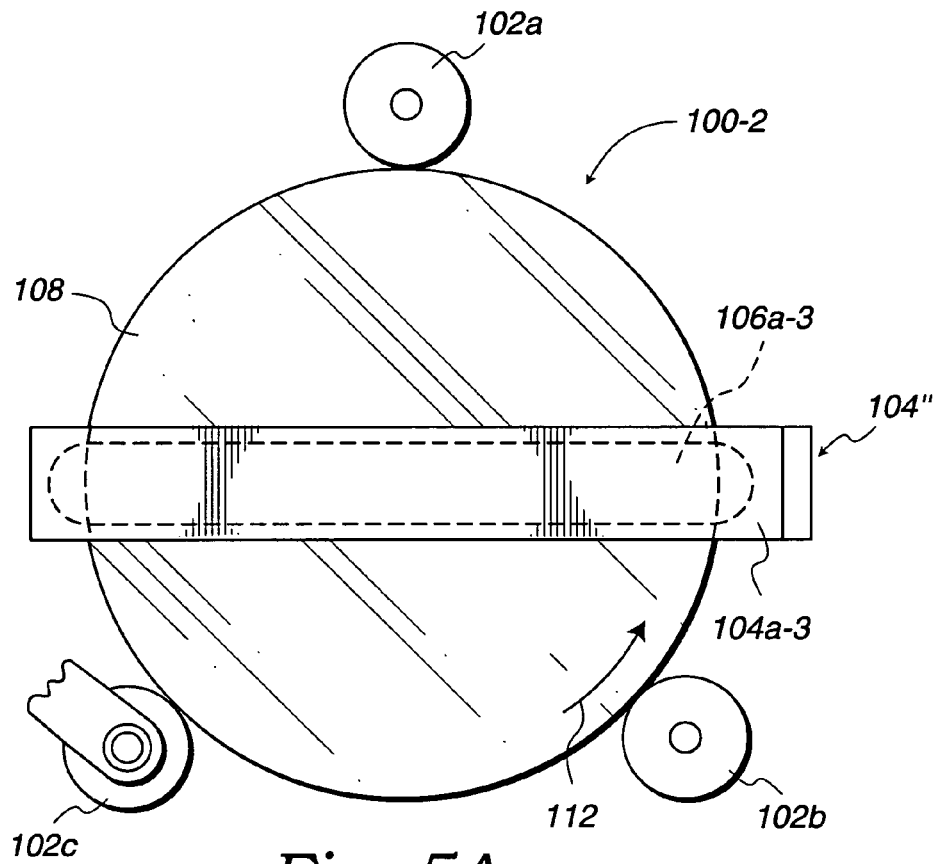
FIG. 5A shows a top view of a wafer cleaning and drying system with a proximity head in a horizontal configuration which extends across a diameter of the wafer 108 in accordance with one embodiment of the present invention.

FIG. 5A shows a top view of a wafer cleaning and drying system 100-2 with a proximity head 106a-3 in a horizontal configuration which extends across a diameter of the wafer 108 in accordance with one embodiment of the present invention. In this embodiment, the proximity head 106a-3 is held by an upper arm 104a-3 that extends across a diameter of the wafer 108. In this embodiment, the proximity head 106*a*-3 may be moved into a cleaning/drying position by a vertical movement of the upper arm 104*a*-3 so the proximity head 106*a*-3 can be in a position that is in close proximity to the wafer 108. Once the proximity head 106*a*-3 is in close proximity to the wafer 108, the wafer processing operation of a top surface of the wafer 108 can take place.

Figure 5B:
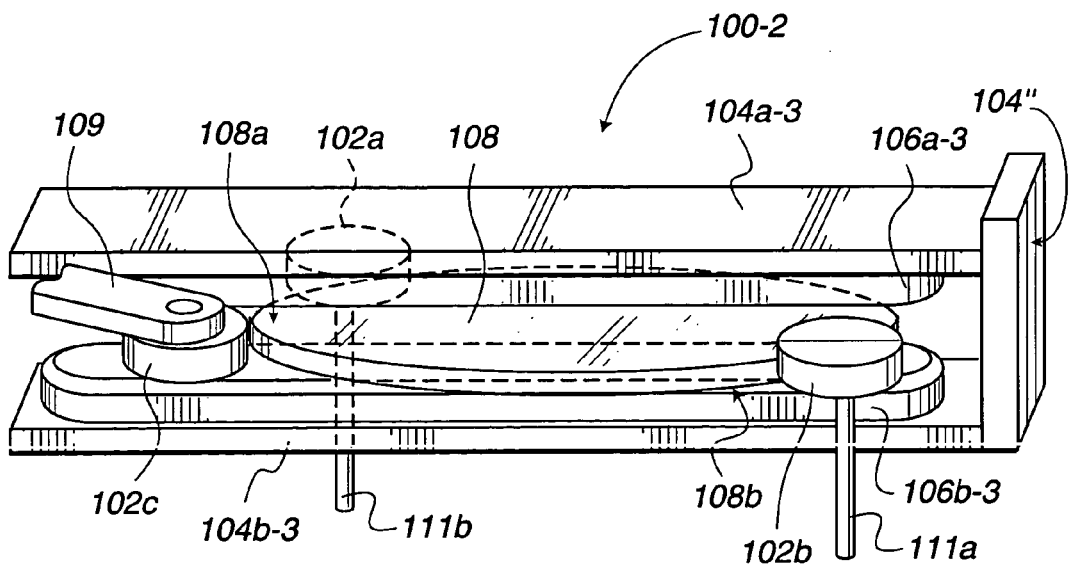
FIG. 5B shows a side view of a wafer cleaning and drying system with the proximity heads in a horizontal configuration which extends across a diameter of the wafer in accordance with one embodiment of the present invention.

FIG. 5B shows a side view of a wafer cleaning and drying system 100-2 with the proximity heads 106*a*-3 and 106*b*-3 in a horizontal configuration which extends across a diameter of the wafer 108 in accordance with one embodiment of the present invention. In this embodiment, the proximity head 106*a*-3 and the proximity head 106*b*-3 both are elongated to be able to span the diameter of the wafer 108. In one embodiment, while the wafer 108 is being rotated, the proximity heads 106*a*-3 and 106*b*-3 are brought to close proximity of the wafer surfaces 108*a* and 108*b* by the top arm 104*a* and a bottom arm 106*b*-3 respectively. Because the proximity heads 106*a*-3 and 106*b*-3 extend across the wafer 108, only half of a full rotation may be needed to clean/dry the wafer 108.

Figure 5C:
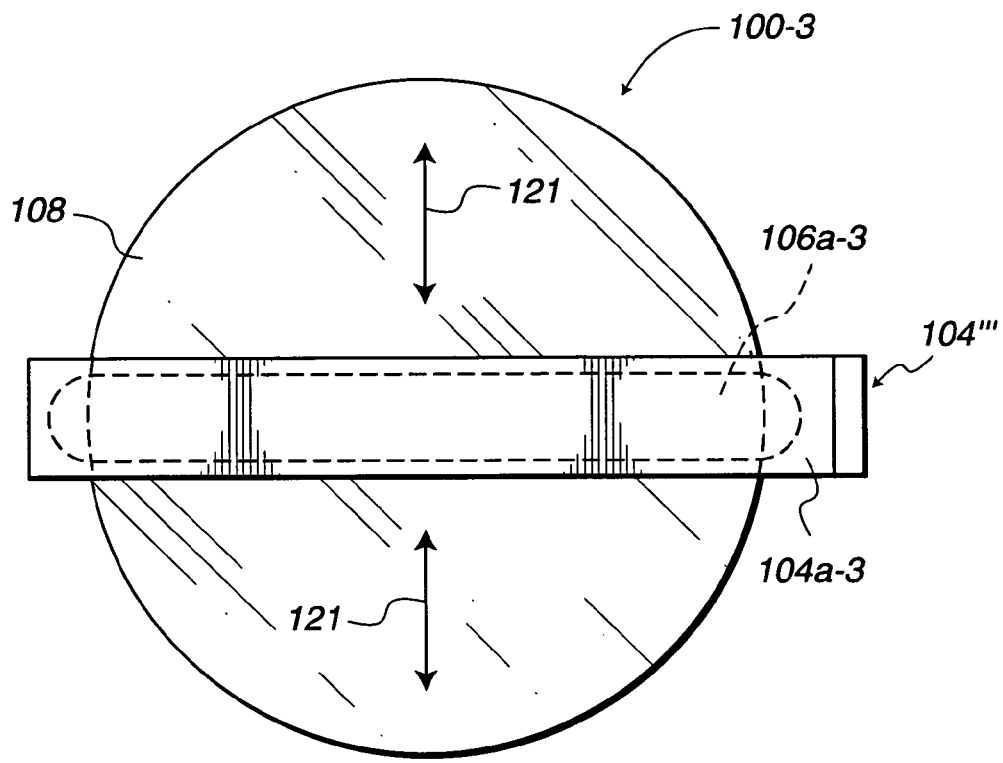
FIG. 5C shows a top view of a wafer cleaning and drying system with the proximity heads in a horizontal configuration which is configured to clean and/or dry the wafer that is stationary in accordance with one embodiment of the present invention.

FIG. 5C shows a top view of a wafer cleaning and drying system 100-3 with the proximity heads 106*a*-3 and 106*b*-3 in a horizontal configuration which is configured to clean and/or dry the wafer 108 that is stationary in accordance with one embodiment of the present invention. In this embodiment, the wafer 108 may be held stationary by any suitable type of wafer holding device such as, for example, an edge grip, fingers with edge attachments, etc. The proximity head carrier assembly 104′″ is configured to be movable from one edge of the wafer 108 across the diameter of the wafer 108 to an edge on the other side of the wafer 108 after crossing the entire wafer diameter. In this fashion, the proximity head 106*a*-3 and/or the proximity head 106*b*-3 (as shown below in reference to FIG. 5D) may move across the wafer following a path along a diameter of the wafer 108 from one edge to an opposite edge. It should be appreciated that the proximity heads 106*a*-3 and/or 106*b*-3 may be move from any suitable manner that would enable moving from one edge of the wafer 108 to another diametrically opposite edge. In one embodiment, the proximity head 106*a*-3 and/or the proximity head 106*b*-3 may move in directions 121 (e.g., top to bottom or bottom to top of FIG. 5C). Therefore, the wafer 108 may stay stationary without any rotation or movement and the proximity heads 106*a*-3 and/or the proximity head 106*b*-3 may move into close proximity of the wafer and, through one pass over the wafer 108, clean/dry the top and/or bottom surface of the wafer 108.

Figure 5D:
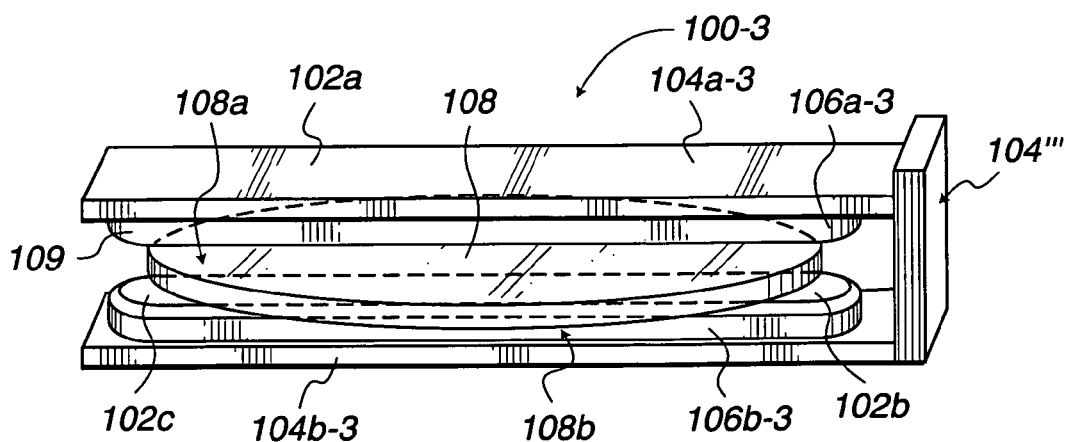
FIG. 5D shows a side view of a wafer cleaning and drying system with the proximity heads in a horizontal configuration which is configured to clean and/or dry the wafer that is stationary in accordance with one embodiment of the present invention.

FIG. 5D shows a side view of a wafer cleaning and drying system 100-3 with the proximity heads 106*a*-3 and 106*b*-3 in a horizontal configuration which is configured to clean and/or dry the wafer 108 that is stationary in accordance with one embodiment of the present invention. In this embodiment, the proximity head 106*a*-3 is in a horizontal position with the wafer 108 also in a horizontal position. By use of the proximity head 106*a*-3 and the proximity head 106*b*-3 that spans at least the diameter of the wafer 108, the wafer 108 may be cleaned and/or dried in one pass by moving proximity heads 106*a*-3 and 106*b*-3 in the direction 121 as discussed in reference to FIG. 5C.

Figure 5E:
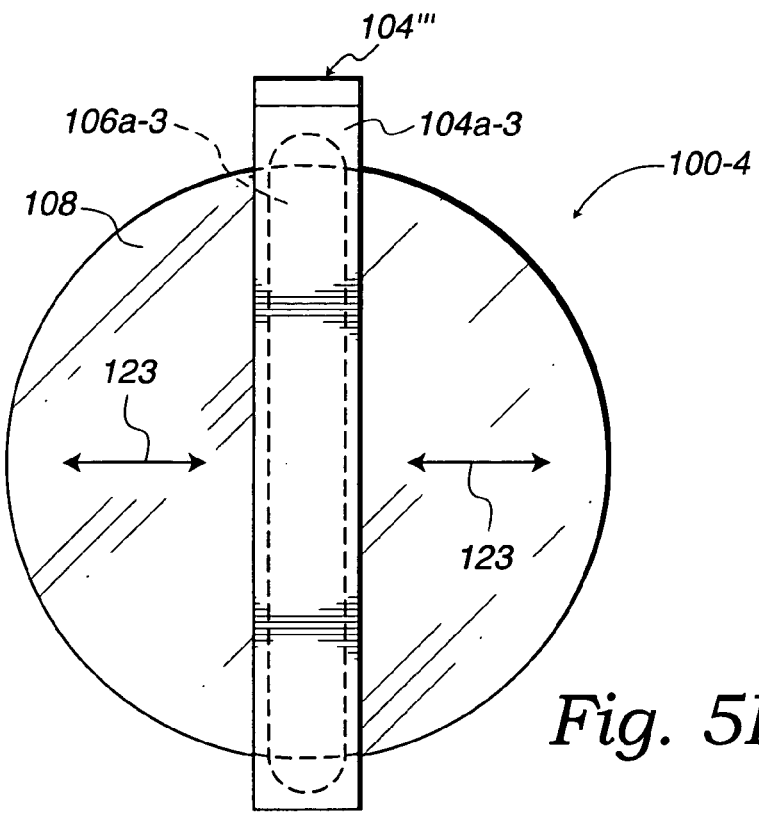
FIG. 5E shows a side view of a wafer cleaning and drying system with the proximity heads in a vertical configuration enabled to clean and/or dry the wafer that is stationary in accordance with one embodiment of the present invention.

FIG. 5E shows a side view of a wafer cleaning and drying system 100-4 with the proximity heads 106*a*-3 and 106*b*-3 in a vertical configuration enabled to clean and/or dry the wafer 108 that is stationary in accordance with one embodiment of the present invention. In this embodiment, the proximity heads 106*a*-3 and 106*b*-3 are in a vertical configuration, and the proximity heads 106*a*-3 and 106*b*-3 are configured to move either from left to right, or from right to left, beginning from a first edge of the wafer 108 to a second edge of the wafer 108 that is diametrically opposite to the first edge. Therefore, in such an embodiment, the proximity head carrier assembly 104′″ may move the proximity heads 104*a*-3 and 104*b*-3 in close proximity with the wafer 108 and also enable the movement of the proximity heads 104*a*-3 and 104*b*-3 across the wafer from one edge to another so the wafer 108 may be processed in one pass thereby decreasing the time to clean and/or dry the wafer 108.

Figure 5F:
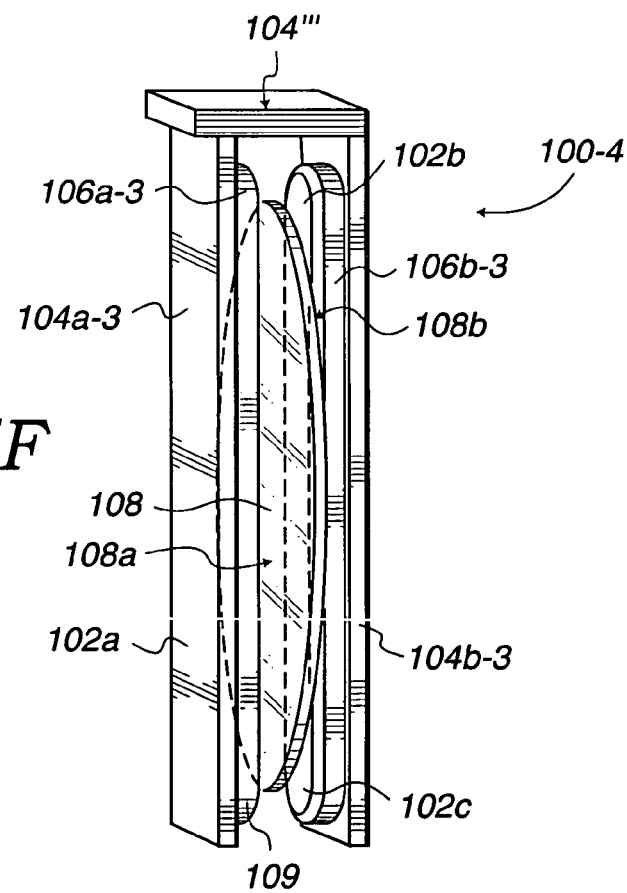
FIG. 5F shows an alternate side view of a wafer cleaning and drying system that is shifted 90 degrees from the side view shown in FIG. 5E in accordance with one embodiment of the present invention.

FIG. 5F shows an alternate side view of a wafer cleaning and drying system 100-4 that is shifted 90 degrees from the side view shown in FIG. 5E in accordance with one embodiment of the present invention. It should be appreciated that the proximity head carrier assembly 104′″ may be oriented in any suitable manner such as for example, having the proximity head carrier assembly 104′″ rotated 180 degrees as compared with what is shown in FIG. 5F.

Figure 5G:
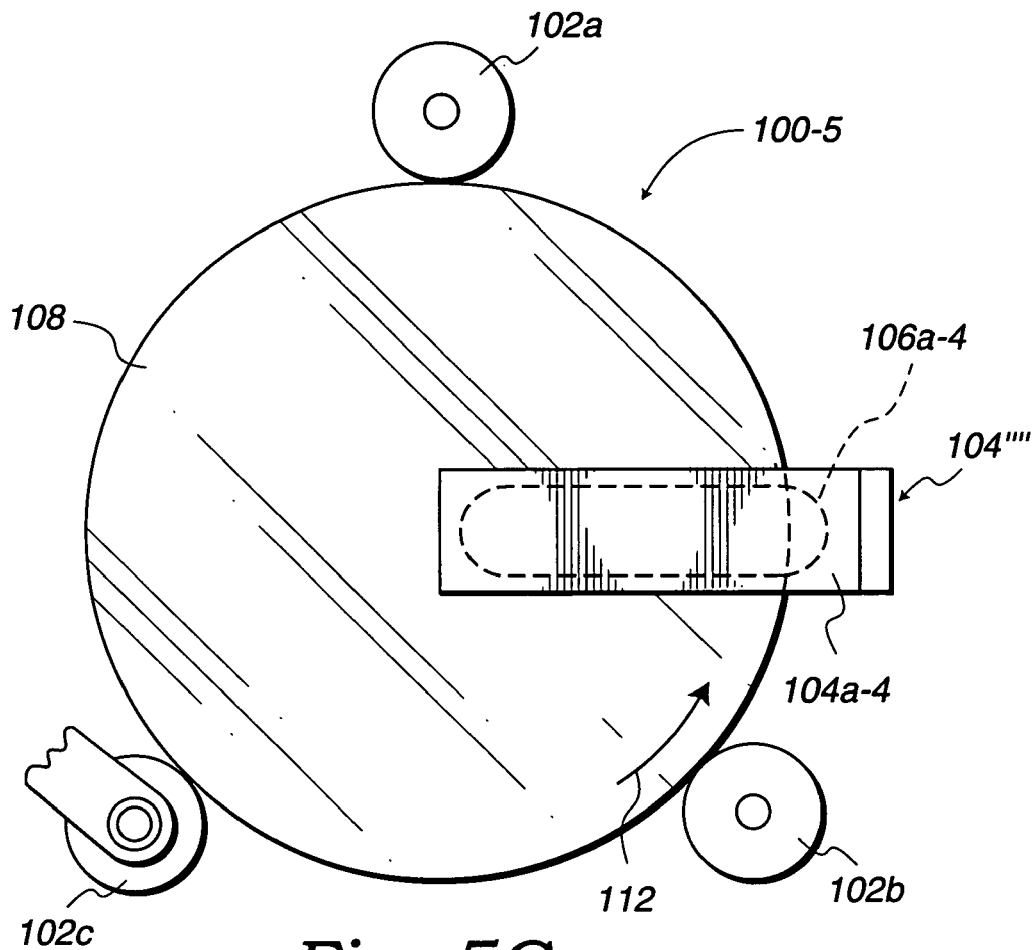
FIG. 5G shows a top view of a wafer cleaning and drying system with a proximity head in a horizontal configuration which extends across a radius of the wafer in accordance with one embodiment of the present invention.

FIG. 5G shows a top view of a wafer cleaning and drying system 100-5 with a proximity head 106*a*-4 in a horizontal configuration which extends across a radius of the wafer 108 in accordance with one embodiment of the present invention. In one embodiment, the proximity head 106*a*-4 extends across less than a radius of a substrate being processed. In another embodiment, the proximity head 106*a*-4 may extend the radius of the substrate being processed. In a preferable embodiment, the proximity head 106*a*-4 extends over a radius of the wafer 108 so the proximity head may process both the center point of the wafer 108 as well as an edge of the wafer 108 so the proximity head 106*a*-4 can cover and process the center point of the wafer and the edge of the wafer. In this embodiment, the proximity head 106*a*-4 may be moved into a cleaning/drying position by a vertical movement of the upper arm 104*a*-4 so the proximity head 106*a*-4 can be in a position that is in close proximity to the wafer 108. Once the proximity head 106*a*-4 is in close proximity to the wafer 108, the wafer processing operation of a top surface of the wafer 108 can take place. Because, in one embodiment, the proximity head 106*a*-4 extends over the radius of the wafer, the wafer may be cleaned and/or dried in one rotation.

Figure 5H:
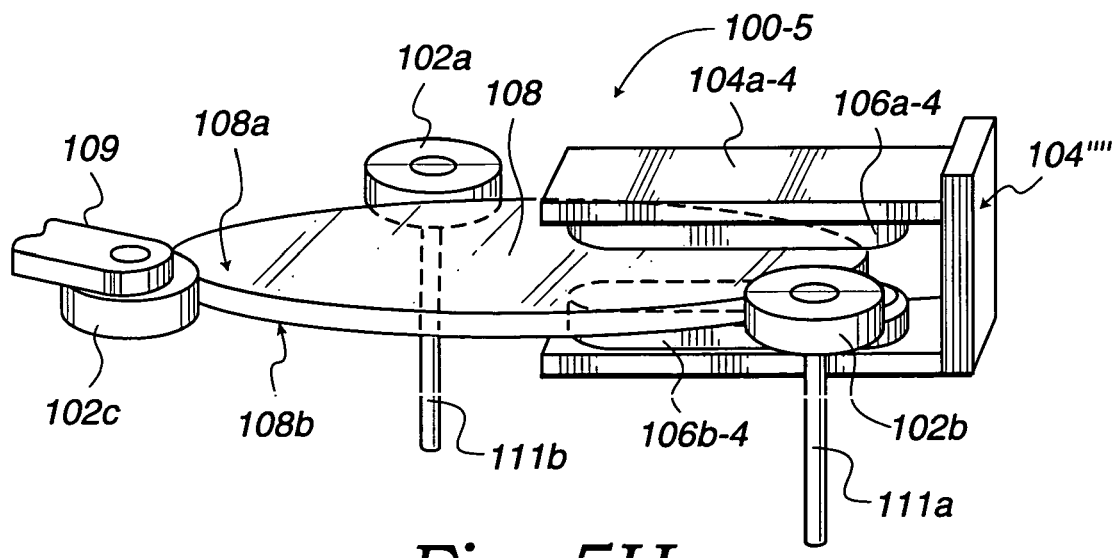
FIG. 5H shows a side view of a wafer cleaning and drying system with the proximity heads and in a horizontal configuration which extends across a radius of the wafer in accordance with one embodiment of the present invention.

FIG. 5H shows a side view of a wafer cleaning and drying system 100-5 with the proximity heads 106*a*-4 and 106*b*-4 in a horizontal configuration which extends across a radius of the wafer 108 in accordance with one embodiment of the present invention. In this embodiment, the proximity head 106*a*-4 and the proximity head 106*b*-4 both are elongated to be able to extend over and beyond the radius of the wafer 108. As discussed in reference to FIG. 5G, depending on the embodiment desired, the proximity head 106*a*-4 may extend less than a radius, exactly a radius, or greater than a radius of the wafer 108. In one embodiment, while the wafer 108 is being rotated, the proximity heads 106*a*-4 and 106*b*-4 are brought to close proximity of the wafer surfaces 108*a* and 108*b* by the top arm 104*a* and a bottom arm 106*b*-4 respectively. Because in one embodiment, the proximity heads 106*a*-4 and 106*b*-4 extend across greater than the radius of the wafer 108, only a full rotation may be needed to clean/dry the wafer 108.

Figure 6A:
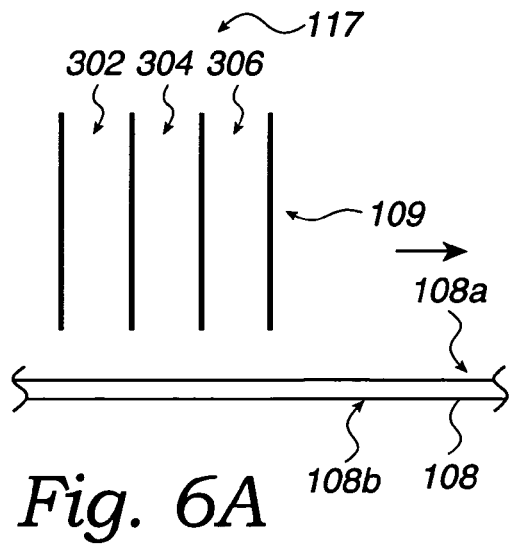
FIG. 6A shows a proximity head inlet/outlet orientation that may be utilized to clean and dry the wafer in accordance with one embodiment of the present invention.

FIG. 6A shows a proximity head inlet/outlet orientation 117 that may be utilized to clean and dry the wafer 108 in accordance with one embodiment of the present invention. In one embodiment, the orientation 117 is a portion of a proximity head 106*a* where other source inlets 302 and 306 in addition to other source outlets 304 may be utilized in addition to the orientation 117 shown. The orientation 117 may include a source inlet 306 on a leading edge 109 with a source outlet 304 in between the source inlet 306 and the source outlet 302.

Figure 6B:
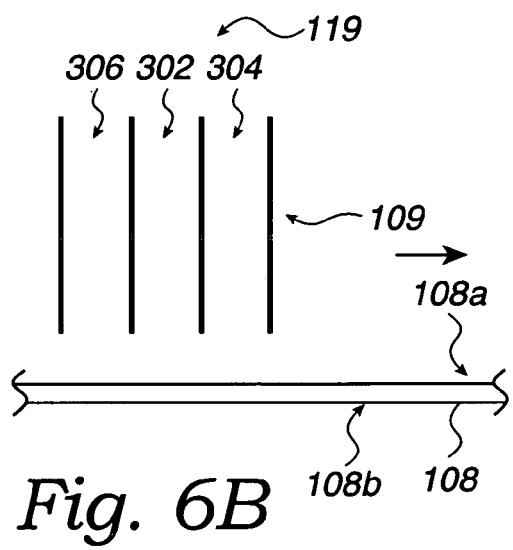
FIG. 6B shows another proximity head inlet/outlet orientation that may be utilized to clean and dry the wafer in accordance with one embodiment of the present invention.

FIG. 6B shows another proximity head inlet/outlet orientation 119 that may be utilized to clean and dry the wafer 108 in accordance with one embodiment of the present invention. In one embodiment, the orientation 119 is a portion of a proximity head 106a where other source inlets 302 and 306 in addition to other source outlets 304 may be utilized in addition to the orientation 119 shown. The orientation 119 may include a source outlet 304 on a leading edge 109 with a source inlet 302 in between the source outlet 304 and the source inlet 306.

Figure 6C:
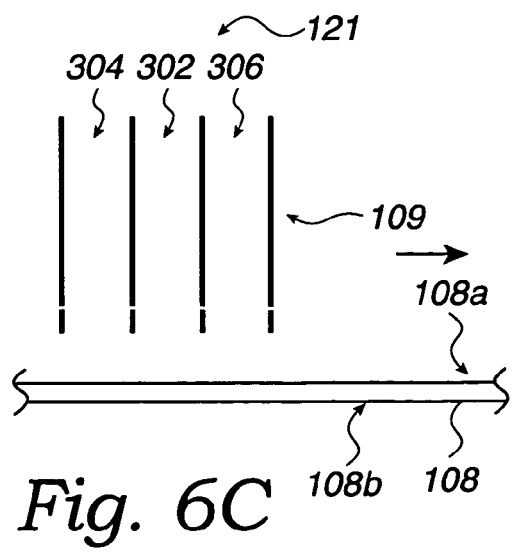
FIG. 6C shows a further proximity head inlet/outlet orientation that may be utilized to clean and dry the wafer in accordance with one embodiment of the present invention.

FIG. 6C shows a further proximity head inlet/outlet orientation 121 that may be utilized to clean and dry the wafer 108 in accordance with one embodiment of the present invention. In one embodiment, the orientation 121 is a portion of a proximity head 106a where other source inlets 302 and 306 in addition to other source outlets 304 may be utilized in addition to the orientation 119 shown. The orientation 119 may include a source inlet 306 on a leading edge 109 with a source inlet 302 in between the source outlet 304 and the source outlet 306.

Figure 6D:
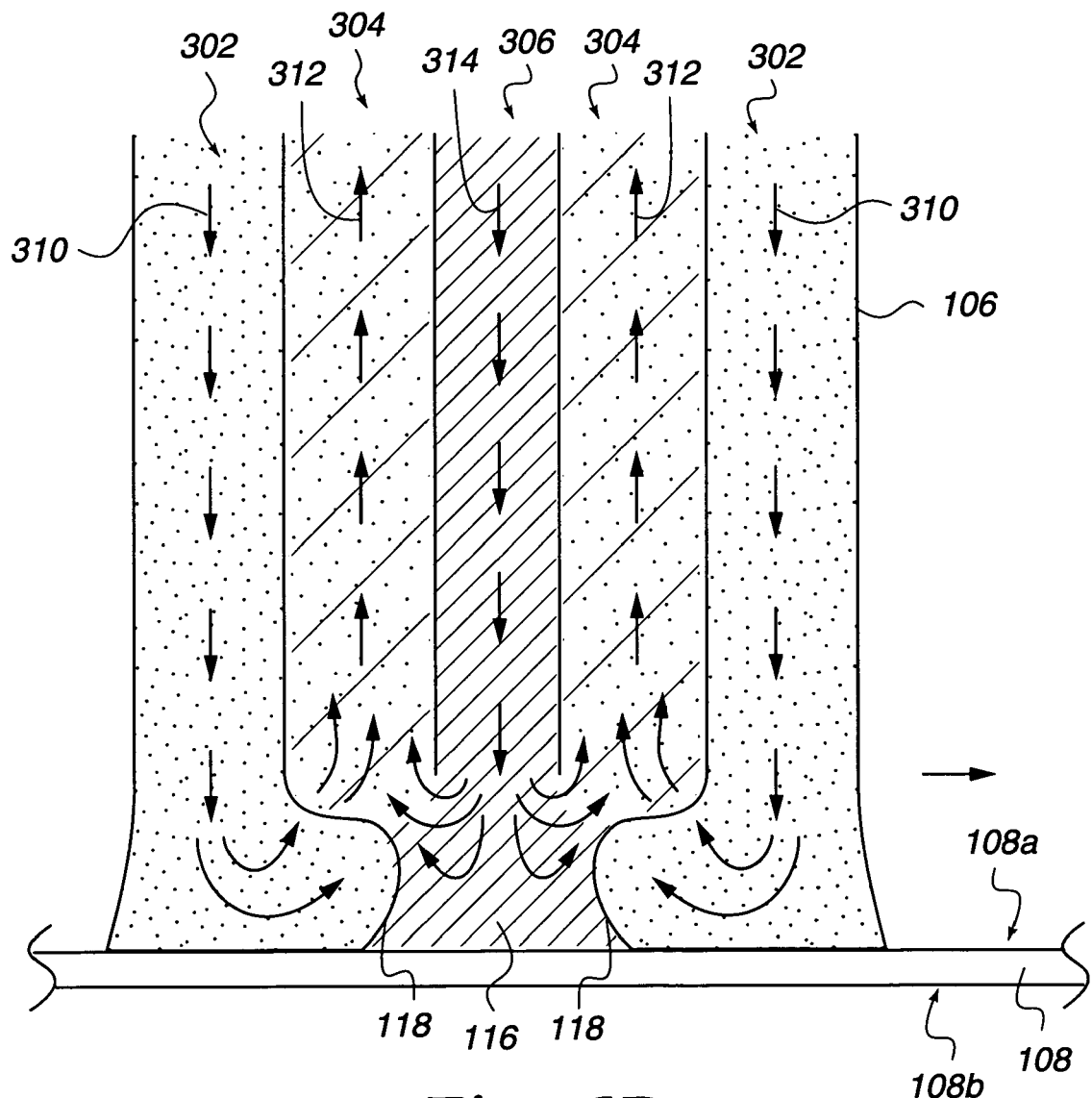
FIG. 6D illustrates a preferable embodiment of a wafer drying process that may be conducted by a proximity head in accordance with one embodiment of the present invention.

FIG. 6D illustrates a preferable embodiment of a wafer drying process that may be conducted by a proximity head 106a in accordance with one embodiment of the present invention. Although FIG. 6 shows a top surface 108a being dried, it should be appreciated that the wafer drying process may be accomplished in substantially the same way for the bottom surface 108b of the wafer 108. In one embodiment, a source inlet 302 may be utilized to apply isopropyl alcohol (IPA) vapor toward a top surface 108a of the wafer 108, and a source inlet 306 may be utilized to apply deionized water (DIW) or cleaning chemistry toward the top surface 108a of the wafer 108. In addition, a source outlet 304 may be utilized to apply vacuum to a region in close proximity to the wafer surface to remove fluid or vapor that may located on or near the top surface 108a. It should be appreciated that any suitable combination of source inlets and source outlets may be utilized as long as at least one combination exists where at least one of the source inlet 302 is adjacent to at least one of the source outlet 304 which is in turn adjacent to at least one of the source inlet 306. The IPA may be in any suitable form such as, for example, IPA vapor where IPA in vapor form is inputted through use of a $N_2$ gas. Moreover, although DIW and/or cleaning chemistry is utilized herein, any other suitable fluid may be utilized that may enable or enhance the wafer processing such as, for example, water purified in other ways, cleaning fluids, etc. In one embodiment, an IPA inflow 310 is provided through the source inlet 302, a vacuum 312 may be applied through the source outlet 304 and DIW/cleaning chemistry inflow 314 may be provided through the source inlet 306. Therefore, an embodiment of the IPA-vacuum-liquid orientation as described above in reference to FIG. 2 is utilized. Consequently, if a first fluid pressure may be applied to the wafer surface by the IPA inflow 310, a second fluid pressure may be applied to the wafer surface by the DIW/cleaning chemistry inflow 314, and a third fluid pressure may be applied by the vacuum 312 to remove the DIW/cleaning chemistry, IPA and contaminants on the wafer surface. In one embodiment of a cleaning operation, a transducer defined within the head 106a may apply acoustic waves such as, for example, megasonic or ultrasonic waves to the meniscus 116 thereby enhancing the cleaning of the wafer due to the cavitations generated in the meniscus 116.

Therefore, in one embodiment, as the DIW/cleaning chemistry inflow 314 and the IPA inflow 310 is applied toward a wafer surface, any fluid and/or contaminants on the wafer surface is intermixed with the DIW/cleaning chemistry inflow 314. At this time, the DIW/cleaning chemistry inflow 314 that is applied toward the wafer surface encounters the IPA inflow 310. The IPA forms an interface 118 (also known as an IPA/DIW interface 118) with the DIW inflow 314 and along with the vacuum 312 assists in the removal of the DIW/cleaning chemistry inflow 314 along with any other fluid from the surface of the wafer 108. In one embodiment, the IPA/liquid interface 118 reduces the surface of tension of the DIW/cleaning chemistry. In operation, the DIW/cleaning chemistry is applied toward the wafer surface and almost immediately removed along with fluid on the wafer surface by the vacuum applied by the source outlet 304. The DIW/cleaning chemistry that is applied toward the wafer surface and for a moment resides in the region between a proximity head and the wafer surface along with any fluid on the wafer surface forms a meniscus 116 where the borders of the meniscus 116 are the IPA/liquid interface 118. Therefore, the meniscus 116 is a constant flow of fluid being applied toward the surface and being removed at substantially the same time with any fluid on the wafer surface. In an exemplary cleaning operation, a transducer in contact with the meniscus 116 may generate acoustic waves and apply the waves to the meniscus 116 thereby generating cavitations in the meniscus 116. These cavitations may serve to enhance the cleaning properties of the cleaning chemistries utilized in the meniscus 116. The nearly immediate removal of the DIW/cleaning chemistries from the wafer surface prevents the formation of fluid droplets on the region of the wafer surface being dried thereby reducing the possibility of contamination drying on the wafer 108. In addition, the contaminants cleaned from the wafer surface is removed in a very short time period thus severely decreasing the possibility of redeposition of the contaminants on the wafer surface. The pressure (which is caused by the flow rate of the IPA) of the downward injection of IPA also helps contain the meniscus 116.

The flow rate of the N2 carrier gas containing the IPA may assist in causing a shift or a push of water/cleaning chemistry flow out of the region between the proximity head and the wafer surface and into the source outlets 304 (suction outlets) through which the fluids may be outputted from the proximity head. It is noted that the push of wafer flow is not a process requirement but can be used to optimize meniscus boundary control. Therefore, as the IPA and the DIW/cleaning chemistry is pulled into the source outlets 304, the boundary making up the IPA/liquid interface 118 is not a continuous boundary because gas (e.g., air) is being pulled into the source outlets 304 along with the fluids. In one embodiment, as the vacuum from the source outlet 304 pulls the DIW/cleaning chemistry, IPA, and the fluid/contaminants on the wafer surface, the flow into the source outlet 304 is discontinuous. This flow discontinuity is analogous to fluid and gas being pulled up through a straw when a vacuum is exerted on combination of fluid and gas. Consequently, as the proximity head 106a moves, the meniscus moves along with the proximity head, and the region previously occupied by the meniscus has been dried due to the movement of the IPA/liquid interface 118. It should also be understood that the any suitable number of source inlets 302, source outlets 304 and source inlets 306 may be utilized depending on the configuration of the apparatus and the meniscus size and shape desired. In another embodiment, the liquid flow rates and the vacuum flow rates are such that the total liquid flow into the vacuum outlet is continuous, so no gas flows into the vacuum outlet.

It should be appreciated that any suitable flow rate may be utilized for the N$_2$/IPA, DIW/cleaning chemistry, and vacuum as long as the meniscus 116 can be maintained. In one embodiment, the flow rate of the DIW/cleaning chemistry through a set of the source inlets 306 is between about 25 ml per minute to about 3,000 ml per minute. In a preferable embodiment, the flow rate of the DIW/cleaning chemistry through the set of the source inlets 306 is about 400 ml per minute. It should be understood that the flow rate of fluids may vary depending on the size of the proximity head. In one embodiment a larger head may have a greater rate of fluid flow than smaller proximity heads. This may occur because larger proximity heads, in one embodiment, have more source inlets 302 and 306 and source outlets 304.

In one embodiment, the flow rate of the N$_2$/IPA vapor through a set of the source inlets 302 is between about 1 standard cubic feet per hour (SCFH) to about 100 SCFH. In a preferable embodiment, the IPA flow rate is between about 5 and 50 SCFH.

In one embodiment, the flow rate for the vacuum through a set of the source outlets 304 is between about 10 standard cubic feet per hour (SCFH) to about 1250 SCFH. In a preferable embodiment, the flow rate for a vacuum though the set of the source outlets 304 is about 350 SCFH. In an exemplary embodiment, a flow meter may be utilized to measure the flow rate of the N$_2$/IPA, DIW/cleaning chemistry, and the vacuum.

Figure 6E:
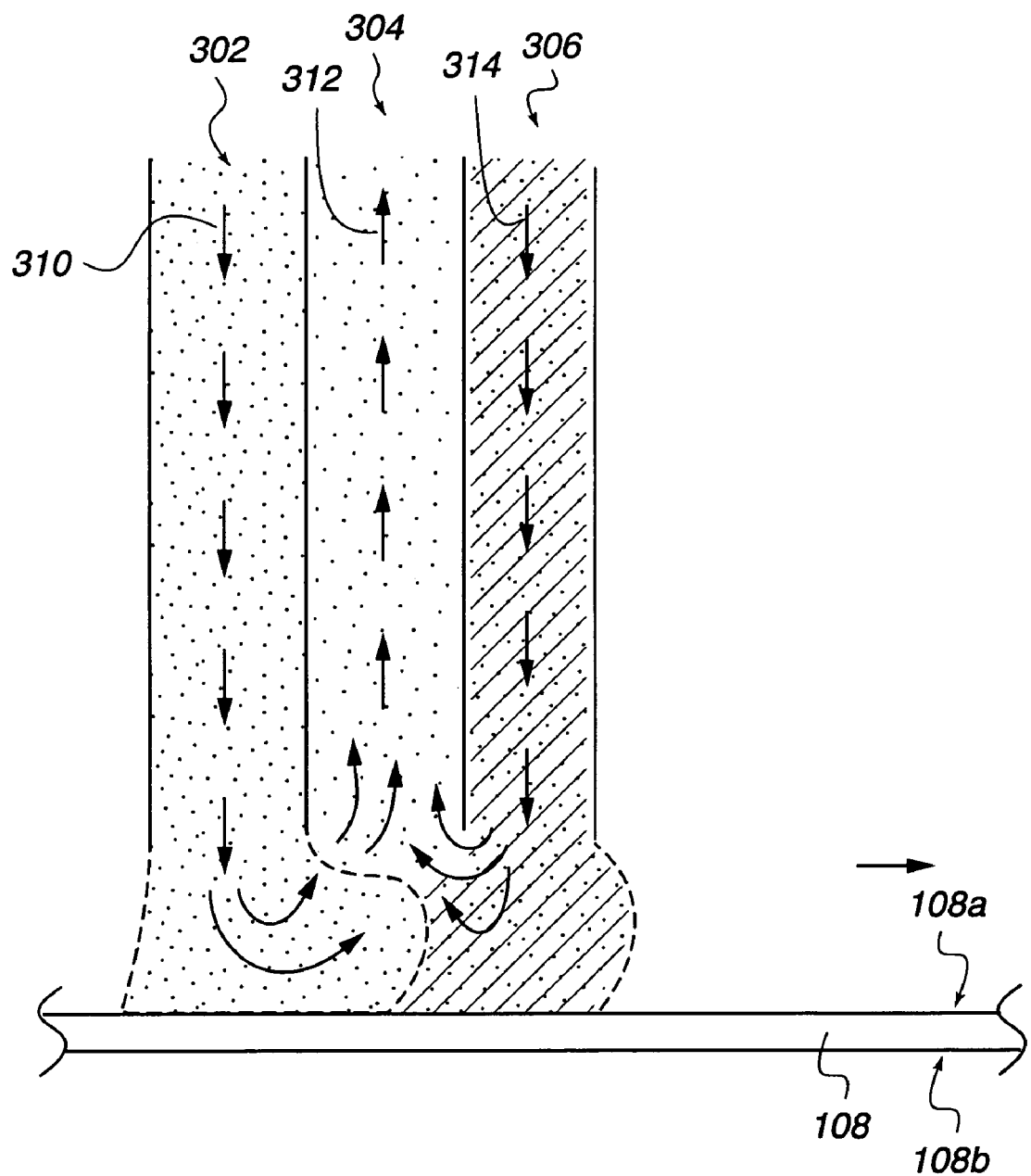
FIG. 6E shows another wafer drying process using another source inlet/outlet orientation that may be conducted by a proximity head in accordance with one embodiment of the present invention.

FIG. 6E shows another wafer drying process using another source inlet/outlet orientation that may be conducted by a proximity head 106a in accordance with one embodiment of the present invention. In this embodiment, the proximity head 106a may be moved over the top surface 108a of the wafer 108 so the meniscus may be moved along the wafer surface 108a. The meniscus applies fluid to the wafer surface and removes fluid from the wafer surface thereby cleaning and drying the wafer simultaneously. In this embodiment, the source inlet 306 applies a DIW/cleaning chemistry flow 314 toward the wafer surface 108a, the source inlet 302 applies IPA flow 310 toward the wafer surface 108a, and the source outlet 312 removes fluid from the wafer surface 108a. It should be appreciated that in this embodiment as well as other embodiments of the proximity head 106a described herein, additional numbers and types of source inlets and source outlets may be used in conjunction with the orientation of the source inlets 302 and 306 and the source outlets 304 shown in FIG. 6E. In addition, in this embodiment as well as other proximity head embodiments, by controlling the amount of flow of fluids onto the wafer surface 108a and by controlling the vacuum applied, the meniscus may be managed and controlled in any suitable manner. For example, in one embodiment, by increasing the DIW/cleaning chemistry flow 314 and/or decreasing the vacuum 312, the outflow through the source outlet 304 may be nearly all DIW/cleaning chemistry and the fluids and contaminants being removed from the wafer surface 108a. In another embodiment, by decreasing the DIW/cleaning chemistry flow 314 and/or increasing the vacuum 312, the outflow through the source outlet 304 may be substantially a combination of DIW/cleaning chemistry and air as well as fluids being removed from the wafer surface 108a.

Figure 6F:
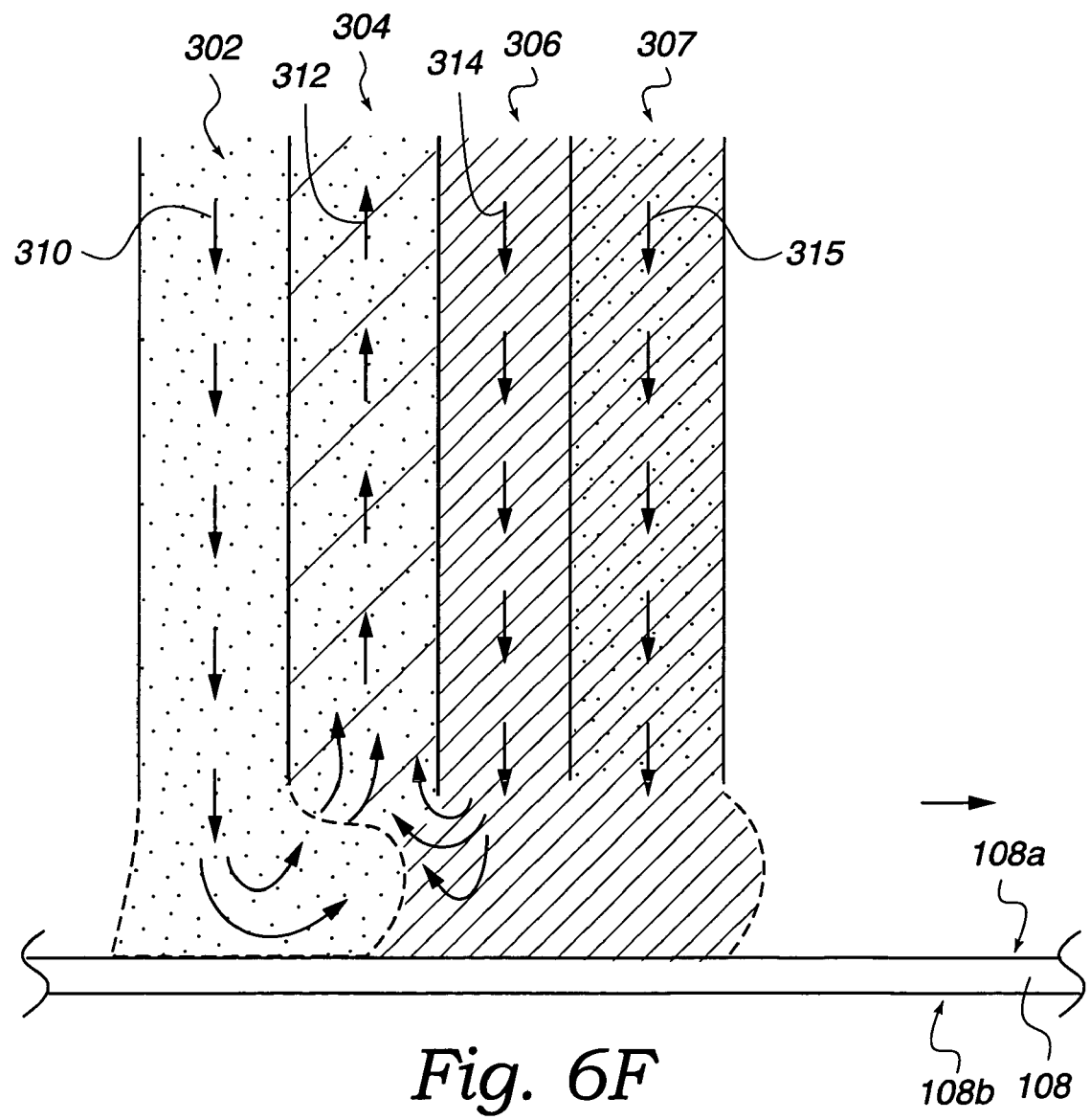
FIG. 6F shows another source inlet and outlet orientation where an additional source outlet may be utilized to input an additional fluid in accordance with one embodiment of the present invention.

FIG. 6F shows another source inlet and outlet orientation where an additional source outlet 307 may be utilized to input an additional fluid in accordance with one embodiment of the present invention. The orientation of inlets and outlets as shown in FIG. 6E is the orientation described in further detail in reference to FIG. 6D except the additional source outlet 307 is included adjacent to the source inlet 306 on a side opposite that of the source outlet 304. In such an embodiment, DIW/cleaning chemistry may be inputted through the source inlet 306 while a different solution such as, for example, a cleaning solution may be inputted through the source inlet 307. Therefore, a cleaning solution flow 315 may be utilized to enhance cleaning of the wafer 108 while at substantially the same time drying the top surface 108a of the wafer 108.

Figure 7B:
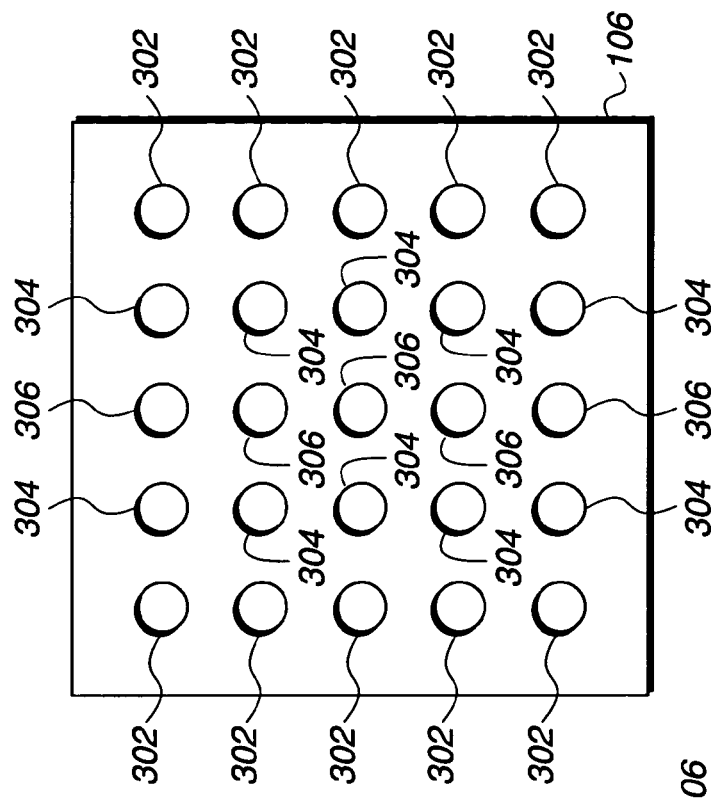
FIG. 7B shows a top view of a portion of a proximity head in accordance with one embodiment of the present invention.
Figure 7A:
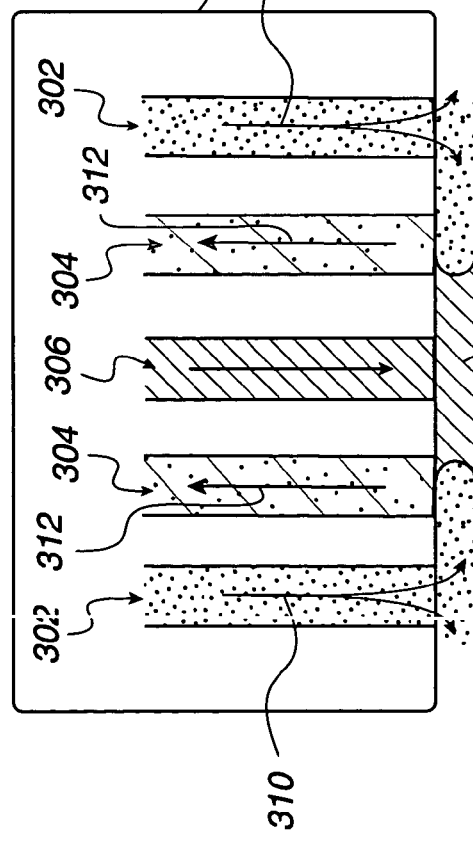
FIG. 7A illustrates a proximity head performing a drying operation in accordance with one embodiment of the present invention.

FIG. 7A illustrates a proximity head 106 performing a drying operation in accordance with one embodiment of the present invention. The proximity head 106, in one embodiment, moves while in close proximity to the top surface 108a of the wafer 108 to conduct a cleaning and/or drying operation. It should be appreciated that the proximity head 106 may also be utilized to process (e.g., clean, dry, etc.) the bottom surface 108b of the wafer 108. In one embodiment, the wafer 108 is rotating so the proximity head 106 may be moved in a linear fashion along the head motion while fluid is removed from the top surface 108a. By applying the IPA 310 through the source inlet 302, the vacuum 312 through source outlet 304, and the DIW/cleaning chemistry flow 314 through the source inlet 306, the meniscus 116 as discussed in reference to FIG. 6 may be generated.

FIG. 7B shows a top view of a portion of a proximity head 106 in accordance with one embodiment of the present invention. In the top view of one embodiment, from left to right are a set of the source inlet 302, a set of the source outlet 304, a set of the source inlet 306, a set of the source outlet 304, and a set of the source inlet 302. Therefore, as N$_2$/IPA and DIW/cleaning chemistry are inputted into the region between the proximity head 106 and the wafer 108, the vacuum removes the N$_2$/IPA and the DIW/cleaning chemistry along with any fluid film and/or contaminants that may reside on the wafer 108. The source inlets 302, the source inlets 306, and the source outlets 304 described herein may also be any suitable type of geometry such as for example, circular opening, triangle opening, square opening, etc. In one embodiment, the source inlets 302 and 306 and the source outlets 304 have circular openings.

Figure 7C:
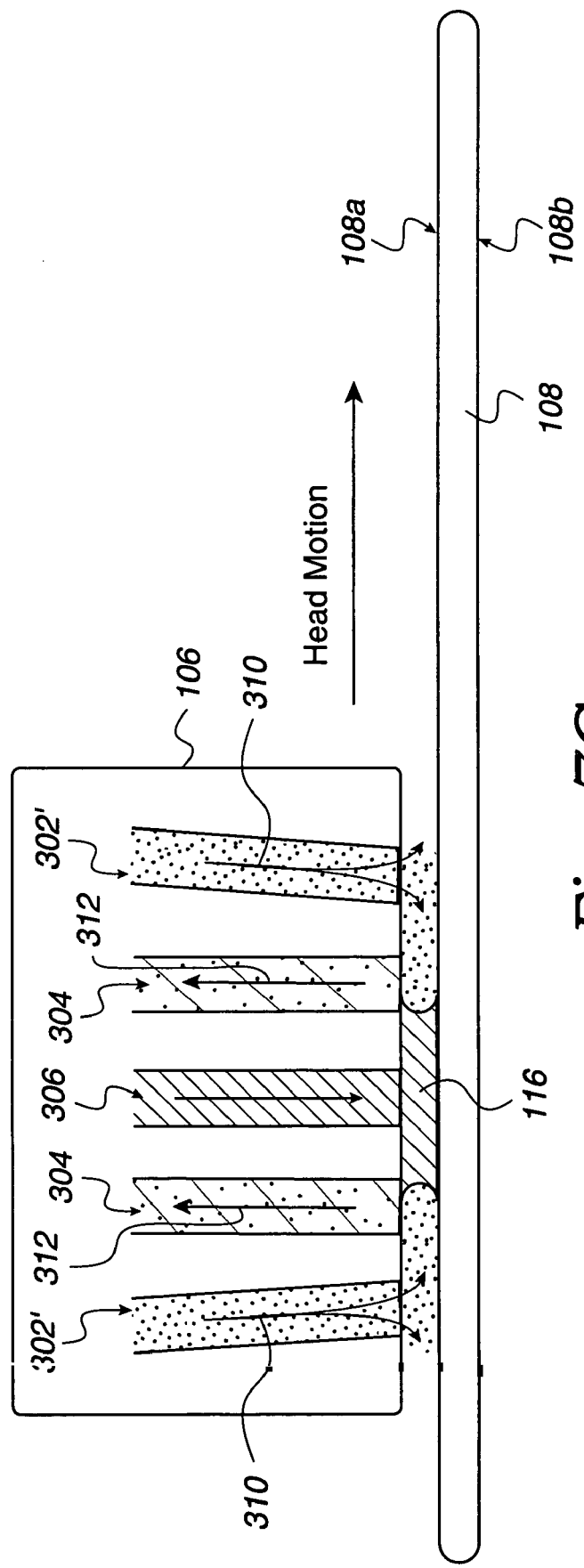
FIG. 7C illustrates a proximity head with angled source inlets performing a drying operation in accordance with one embodiment of the present invention.

FIG. 7C illustrates a proximity head 106 with angled source inlets 302' performing a drying operation in accordance with one embodiment of the present invention. It should be appreciated that the source inlets 302' and 306 and the source outlet(s) 304 described herein may be angled in any suitable way to optimize the wafer cleaning and/or drying process. In one embodiment, the angled source inlets 302' that input IPA vapor onto the wafer 108 is angled toward the source inlets 306 such that the IPA vapor flow is directed to contain the meniscus 116.

Figure 7D:
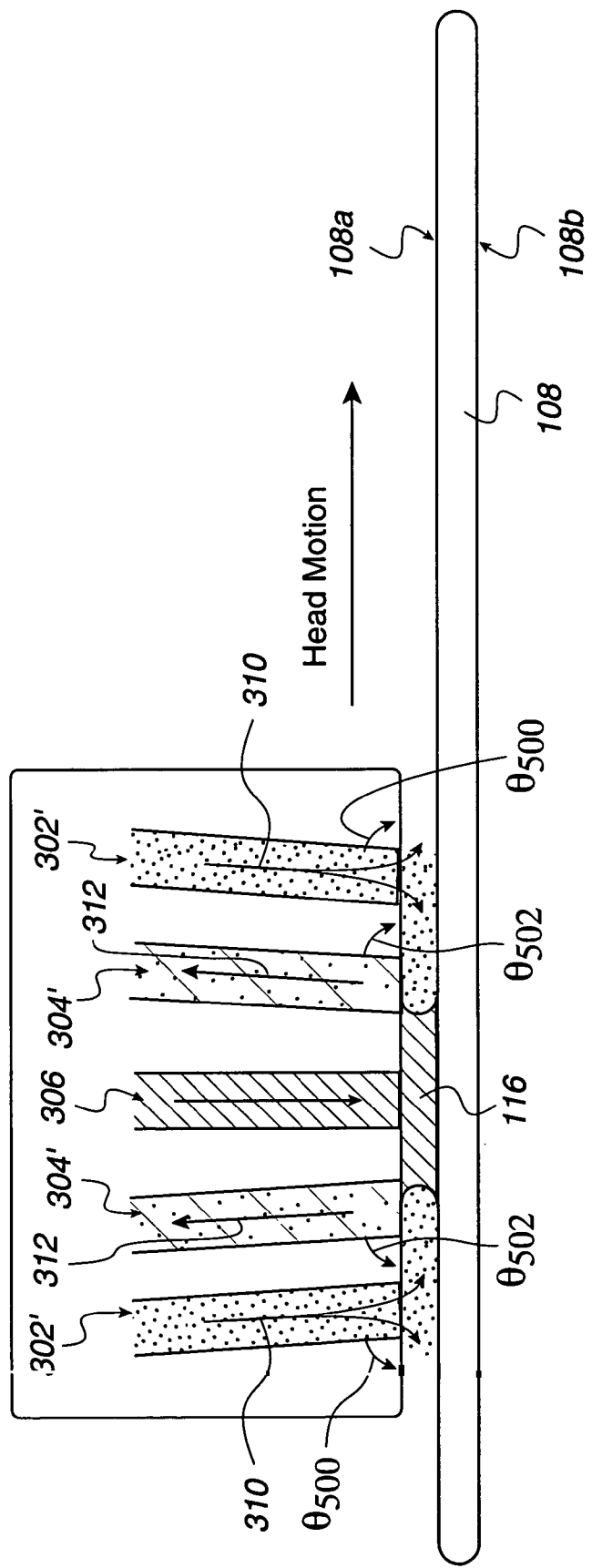
FIG. 7D illustrates a proximity head with angled source inlets and angled source outlets performing a drying operation in accordance with one embodiment of the present invention.

FIG. 7D illustrates a proximity head 106 with angled source inlets 302' and angled source outlets 304' performing a drying operation in accordance with one embodiment of the present invention. It should be appreciated that the source inlets 302' and 306 and the angled source outlet(s) 304' described herein may be angled in any suitable way to optimize the wafer cleaning and/or drying process.

In one embodiment, the angled source inlets 302' that input IPA vapor onto the wafer 108 is angled at an angle $\theta_{500}$ toward the source inlets 306 such that the IPA vapor flow is directed to contain the meniscus 116. The angled source outlet 304' may, in one embodiment, be angled at an angle $\theta_{500}$ towards the meniscus 116. It should be appreciated that the angle $\theta_{500}$ and the angle $\theta_{502}$ may be any suitable angle that would optimize the management and control of the meniscus 116. In one embodiment, the angle $\theta_{500}$ is greater than 0 degrees and less than 90 degrees, and the angle $\theta_{502}$ is greater than 0 degrees and less than 90 degrees. In a preferable embodiment, the angle $\theta_{500}$ is about 15 degrees, and in another preferable embodiment, the angle angled at an angle $\theta_{502}$ is about 15 degrees. The angle $\theta_{500}$ and the angle $\theta_{502}$ adjusted in any suitable manner to optimize meniscus management. In one embodiment, the angle $\theta_{500}$ and the angle $\theta_{502}$ may be the same, and in another embodiment, the angle $\theta_{500}$ and the angle $\theta_{502}$ may be different. By angling the angled source inlet(s) 302' and/or angling the angled source outlet(s) 304', the border of the meniscus may be more clearly defined and therefore control the drying and/or cleaning the surface being processed.

Figure 8A:
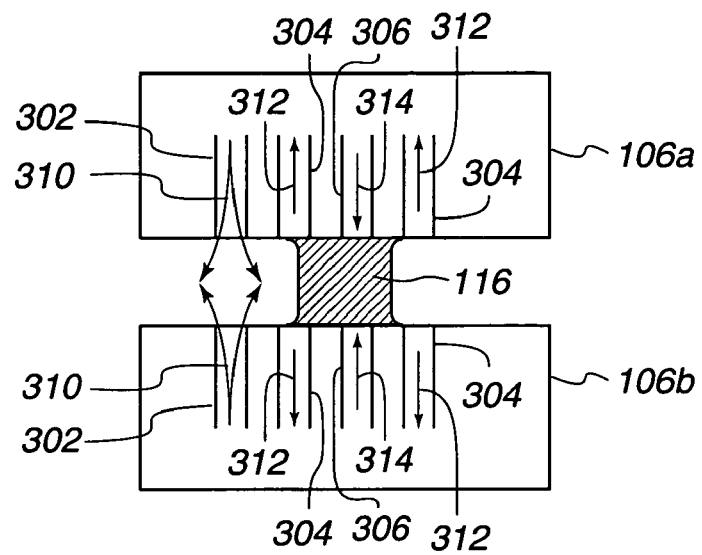
FIG. 8A illustrates a side view of the proximity heads for use in a dual wafer surface cleaning and drying system in accordance with one embodiment of the present invention.

FIG. 8A illustrates a side view of the proximity heads 106 and 106b for use in a dual wafer surface cleaning and drying system in accordance with one embodiment of the present invention. In this embodiment, by usage of source inlets 302 and 306 to input $N_2$/IPA and DIW/cleaning chemistry respectively along with the source outlet 304 to provide a vacuum, the meniscus 116 may be generated. In addition, on the side of the source inlet 306 opposite that of the source inlet 302, there may be a source outlet 304 to remove DIW/cleaning chemistry and to keep the meniscus 116 intact. As discussed above, in one embodiment, the source inlets 302 and 306 may be utilized for IPA inflow 310 and DIW/cleaning chemistry inflow 314 respectively while the source outlet 304 may be utilized to apply vacuum 312. It should be appreciated that any suitable configuration of source inlets 302, source outlets 304 and source inlets 306 may be utilized. For example, the proximity heads 106 and 106b may have a configuration of source inlets and source outlets like the configuration described above in reference to FIGS. 7A and 7B. In addition, in yet more embodiments, the proximity heads 106 and 106b may be of a configuration as shown below in reference to FIGS. 9 through 15. Any suitable surface coming into contact with the meniscus 116 may be dried by the movement of the meniscus 116 into and away from the surface.

Figure 8B:
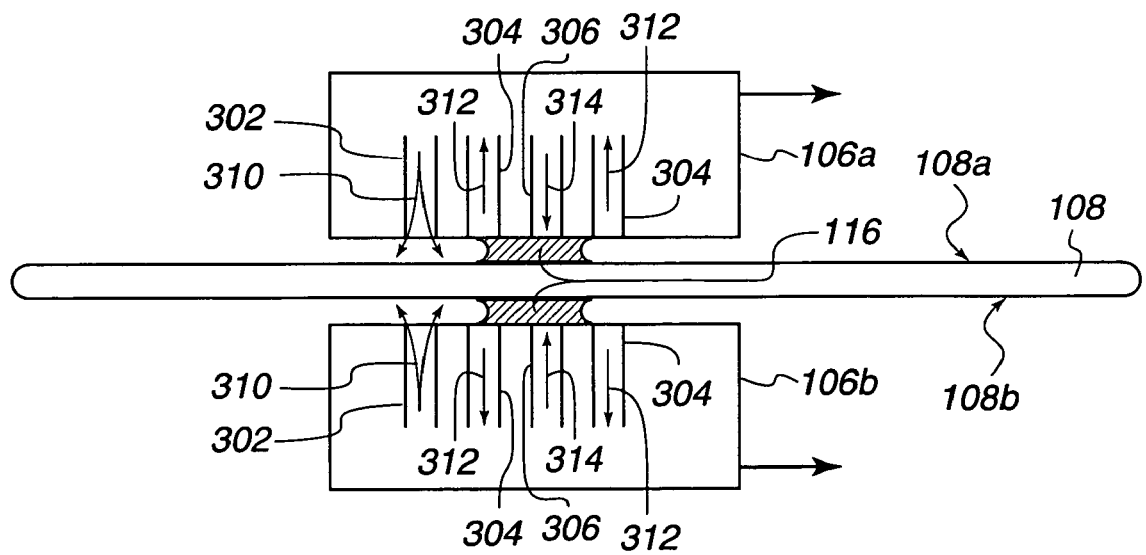
FIG. 8B shows the proximity heads in a dual wafer surface cleaning and drying system in accordance with one embodiment of the present invention.

FIG. 8B shows the proximity heads 106 and 106b in a dual wafer surface cleaning and drying system in accordance with one embodiment of the present invention. In this embodiment, the proximity head 106 processes the top surface 108a of the wafer 108, and the proximity head 106b processes the bottom surface of 108b of the wafer 108. By the inputting of the $N_2$/IPA and the DIW/cleaning chemistry by the source inlets 302 and 306 respectively, and by use of the vacuum from the source outlet 304, the meniscus 116 may be formed between the proximity head 106 and the wafer 108 and between the proximity head 106b and the wafer 108. The proximity heads 106 and 106b, and therefore the meniscus 116, may be moved over the wet areas of the wafer surface in an manner so the entire wafer 108 can be cleaned and/or dried.

Figure 9A:
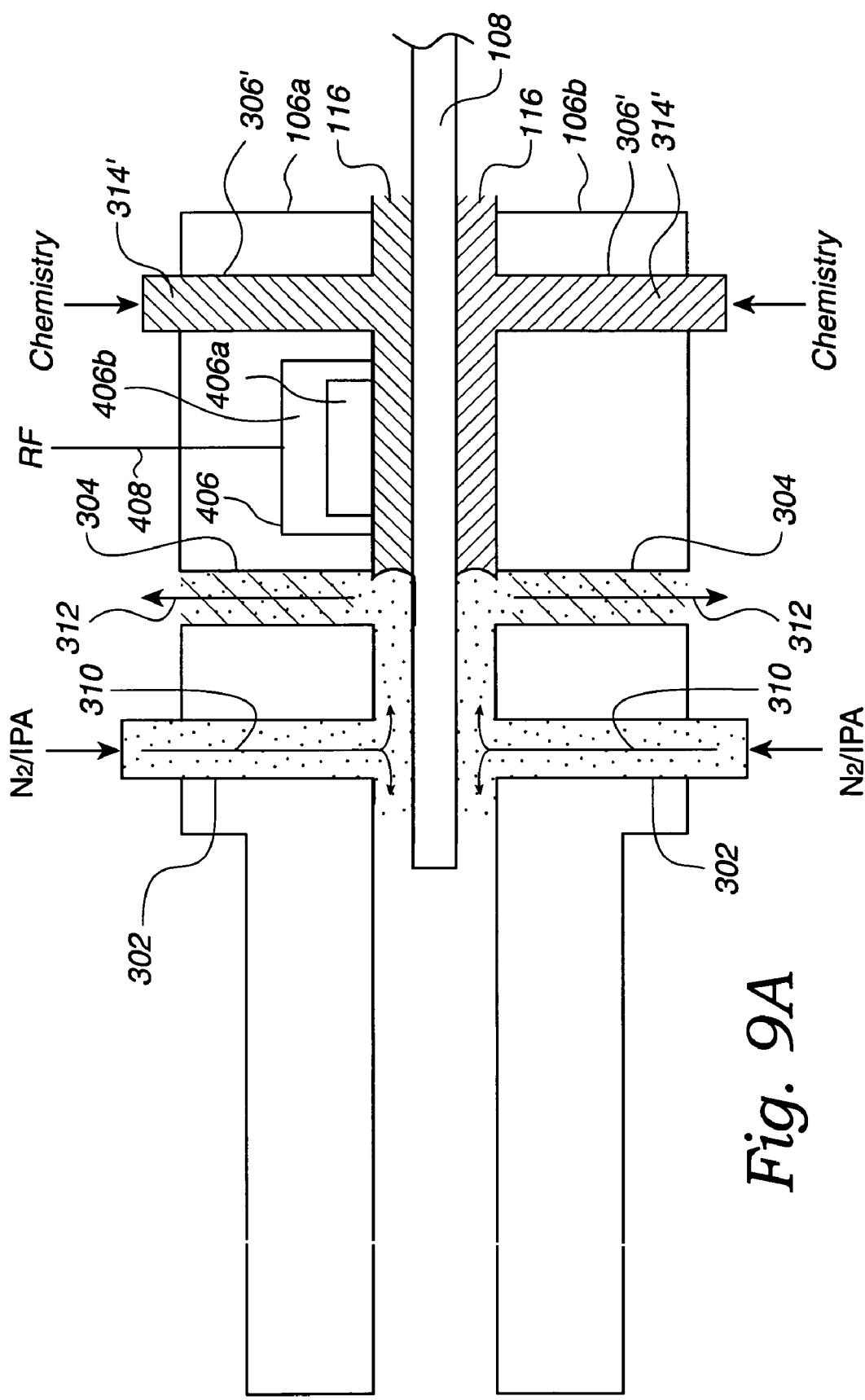
FIG. 9A illustrates a side view of the proximity heads for use in a wafer surface megasonic cleaning system in accordance with one embodiment of the present invention.

FIG. 9A illustrates a side view of the proximity heads 106a and 106b for use in a wafer surface megasonic cleaning system in accordance with one embodiment of the present invention. In this embodiment, by usage of source inlets 302 and 306' to input $N_2$/IPA and cleaning chemistry respectively along with the source outlet 304 to provide a vacuum, the meniscus 116 may be generated. It should be appreciated that any suitable type of chemistry that can clean a wafer surface that is compatible with the material of the proximity heads 106a and 106b may be utilized. In addition, on the side of the source inlet 306' opposite that of the source inlet 302, there may be a source outlet 304 to remove cleaning chemistry and to keep the meniscus 116 intact. The source inlets 302 and 306' may be utilized for IPA inflow 310 and cleaning chemistry inflow 314' respectively while the source outlet 304 may be utilized to apply vacuum 312. It should be appreciated that any suitable configuration of source inlets 302, source outlets 304 and source inlets 306 may be utilized. For example, the proximity heads 106a and 106b may have a configuration of source inlets and source outlets like the configuration described above in reference to FIG. 6A. In addition, in yet more embodiments, the proximity heads 106a and 106b may be of a configuration as shown below in reference to FIGS. 6B through 8B. In another embodiment, the proximity heads 106a and 106b may have different configurations. Any suitable surface coming into contact with the meniscus 116 may be cleaned by the movement of the meniscus 116 into and away from the surface.

The cleaning of the wafer 108 may be enhanced through the use of megasonics. In one embodiment, a transducer 406 may be defined within the proximity head(s) 106a. In a preferable embodiment, a transducer 406 may be defined within the proximity head 106a between the source outlet 304 and the source inlet 306'. Once the meniscus 116 has been formed, an RF supply 408 can supply a transducer 406 with energy. The transducer 406 converts the energy from the RF supply 408 into acoustic energy. It should be appreciated that the transducer may have any suitable configuration that would enable the conversion of RF to acoustic energy. In one embodiment, the transducer 406 is a piezoelectric crystal 406a bonded to a body 406b. In a preferable embodiment, the transducer is coated with a substance such as, for example, Teflon to protect the crystal 406a and the body 406b from the cleaning chemistry and contaminants that may exist on the surface of the wafer being cleaned. The acoustic energy may produce megasonic (600 kHz-1.5 MHz) or ultrasonic (below 600 kHz) waves. In a preferable embodiment, the transducer 406 generates megasonic waves to create cavitations in the meniscus 116. The cavitations of the cleaning chemistry comprising the meniscus 116 enhance cleaning properties of the meniscus 116. Therefore, contaminants cleaned off of the wafer surface by the meniscus 116 is pulled off of the wafer through the source outlet 304. By using megasonics along with the controllable meniscus 116, the apparatus and methods described herein may enable usage of megasonic cleaning in a small volume space thereby enabling fast chemical exchange with improved mass transport during cleaning.

FIG. 9B illustrates a side view of the proximity heads 106a and 106b for use in a dual wafer surface megasonic cleaning system in accordance with one embodiment of the present invention. In this embodiment, by usage of source inlets 302 and 306' to input $N_2$/IPA and cleaning chemistry respectively along with the source outlet 304 to provide a vacuum, the meniscuses 116 may be generated by the heads 106a and 106b on the top surface and the bottom surface of the wafer 108 respectively. In one embodiment, the proximity head 106b may have the same configuration as the proximity head 106a except the proximity head 106b is positioned to process the other side of the wafer 108. In addition, the megasonic transducer 406 may be defined within each of the heads 106a and 106b. The RF supply may provide RF energy for the piezoelectric crystal 406a to convert to acoustic energy. The acoustic energy may then be applied to the meniscuses 116 on both the top surface and the bottom surface of the wafer. Consequently, dual surface megasonic meniscus cleaning may be conducted.

Figure 10:
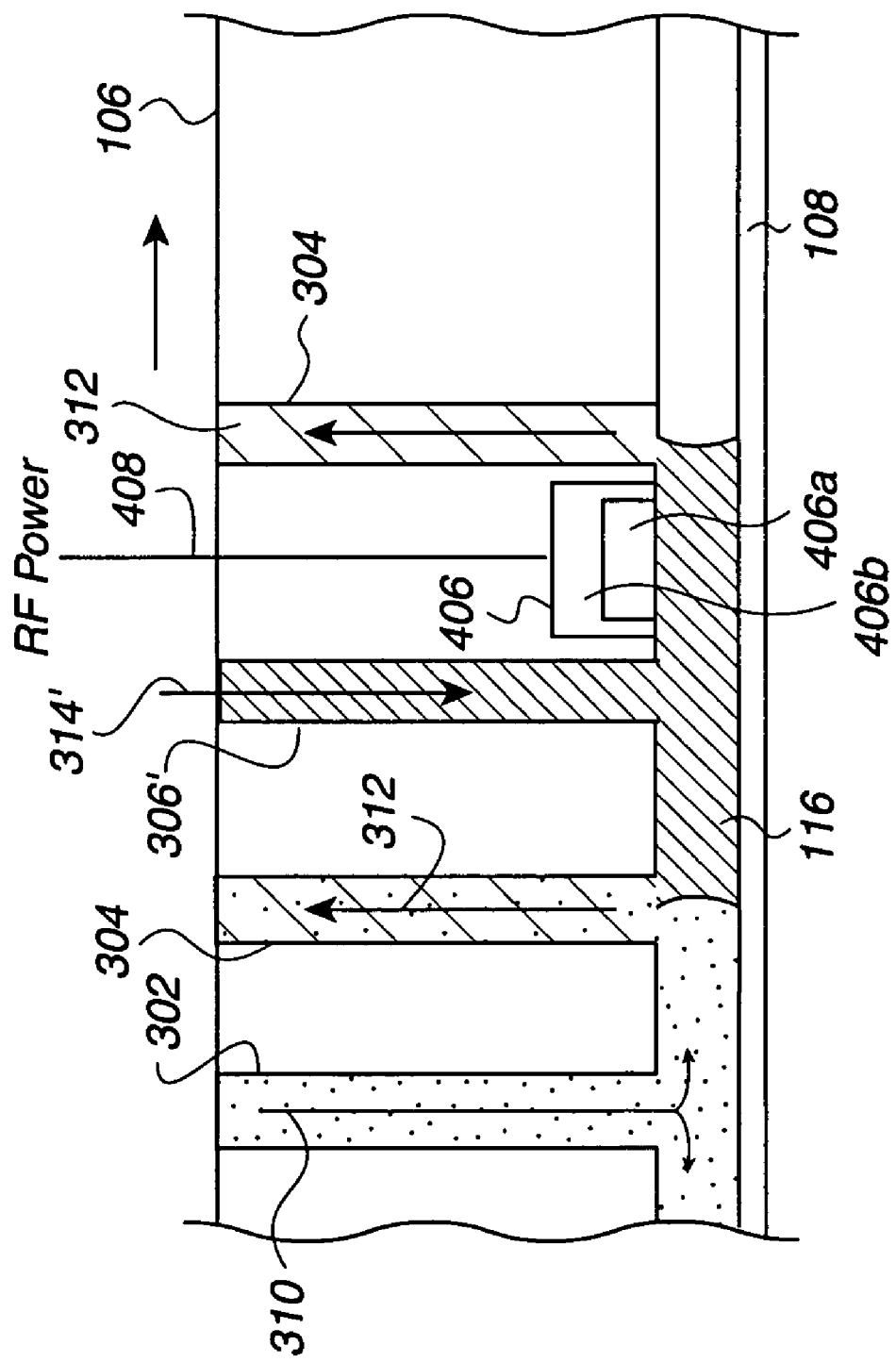
FIG. 10 illustrates a side view of a proximity head where a megasonic transducer is located between a source outlet and a source inlet in accordance with one embodiment of the present invention.

FIG. 10 illustrates a side view of a proximity head 106 where a megasonic transducer 406 is located between a source outlet 304 and a source inlet 306' in accordance with one embodiment of the present invention. In one embodiment, the proximity head 106 has a IPA-vacuum-liquid-megasonic-vacuum configuration. In operation, the IPA/N$_2$ is inputted through the source inlet 302, the vacuum is applied through the source outlet 304, the liquid is applied through the source inlet 306', and megasonic acoustic waves are applied by the transducer 406 to the meniscus 116, and the vacuum on the leading edge side of the proximity head 106 is applied by the source outlet 304. Therefore, in this way, the meniscus 116 comprising the cleaning chemistry may be formed and the megasonic transducer 406 which is in direct contact with the meniscus 116 may apply ultrasonic or megasonic acoustic waves. As discussed above, the acoustic waves may generate cavitation in the meniscus 116 thereby enhancing the cleaning properties of the cleaning chemistry that is in contact with a surface of the wafer 108.

Figure 11:
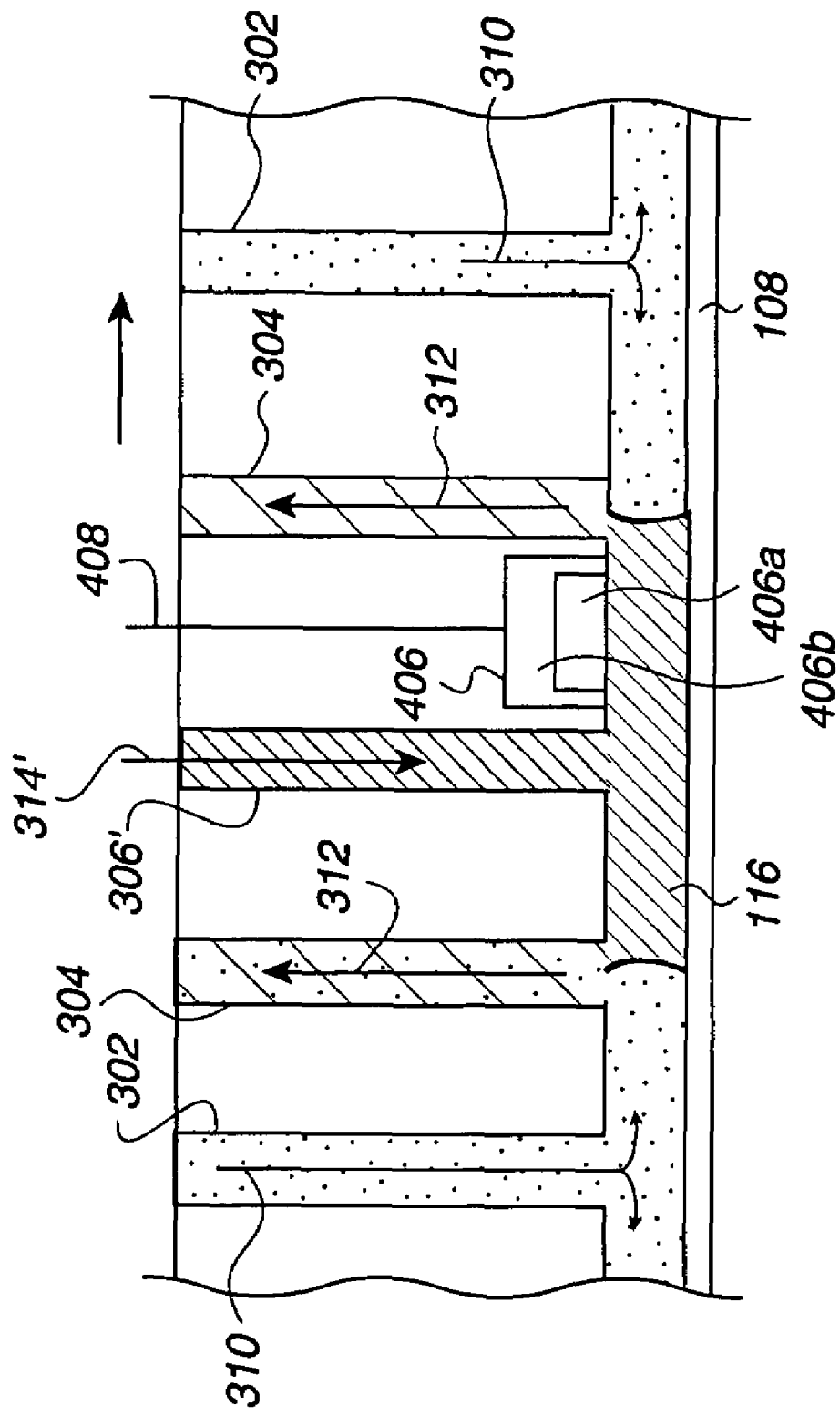
FIG. 11 illustrates a side view of a proximity head with the configuration as discussed in reference to FIG. 7A with a megasonic transducer is located between a source outlet and a source inlet on a leading edge side in accordance with one embodiment of the present invention.

FIG. 11 illustrates a side view of a proximity head 106 with the configuration as discussed in reference to FIG. 7A with a megasonic transducer 406 is located between a source outlet 304 and a source inlet 306' on a leading edge side in accordance with one embodiment of the present invention. In this embodiment, the meniscus 116 may be confined by IPA vapor on both the leading edge and the trailing edge of the proximity head 106. The meniscus 116 is located on a leading edge side of the source inlet 306'.

Figure 12A:
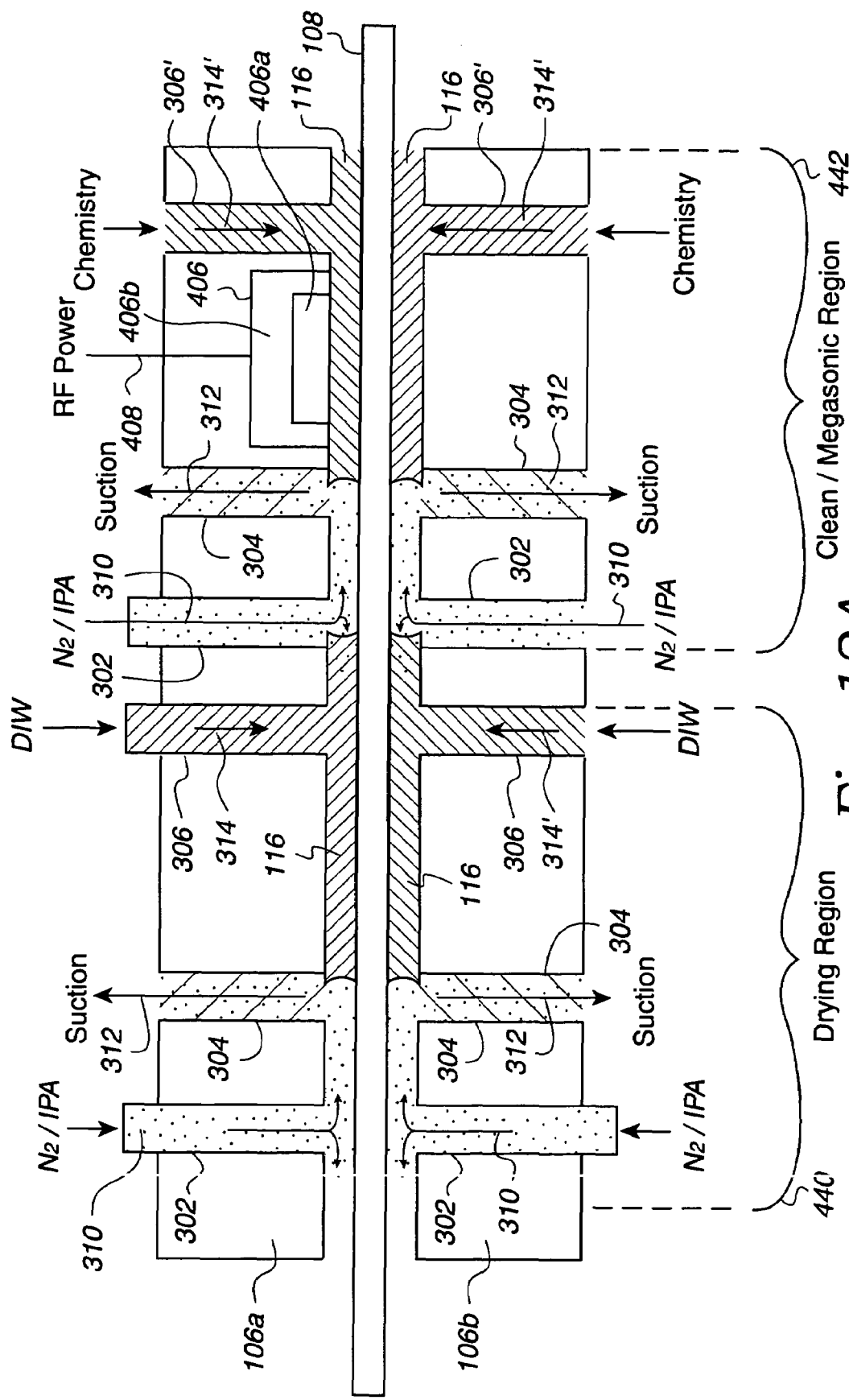
FIG. 12A shows a side view of proximity heads with a combination of a clean/megasonic region and a drying region in accordance with one embodiment of the present invention.

FIG. 12A shows a side view of proximity heads 106a and 106b with a combination of a clean/megasonic region 442 and a drying region 440 in accordance with one embodiment of the present invention. In one embodiment, the clean/megasonic region 442 includes the source inlet 302, the source outlet 304, and the source inlet 306'. The megasonic transducer 406 is defined in the head 106a such a way that the transducer 406 may contact the meniscus 116 in the clean/megasonic region 442. In a preferable embodiment, the clean region 442 is located on a leading edge side of the proximity head 106 as compared with the location of the drying region 440. In one embodiment, the drying region 440 includes the source inlet 302, the source outlet 304, and the source inlet 306. In such an embodiment, the source inlet 306 inputs deionized water. In this way the wafer 108 may be cleaned in a highly efficient manner.

Figure 12B:
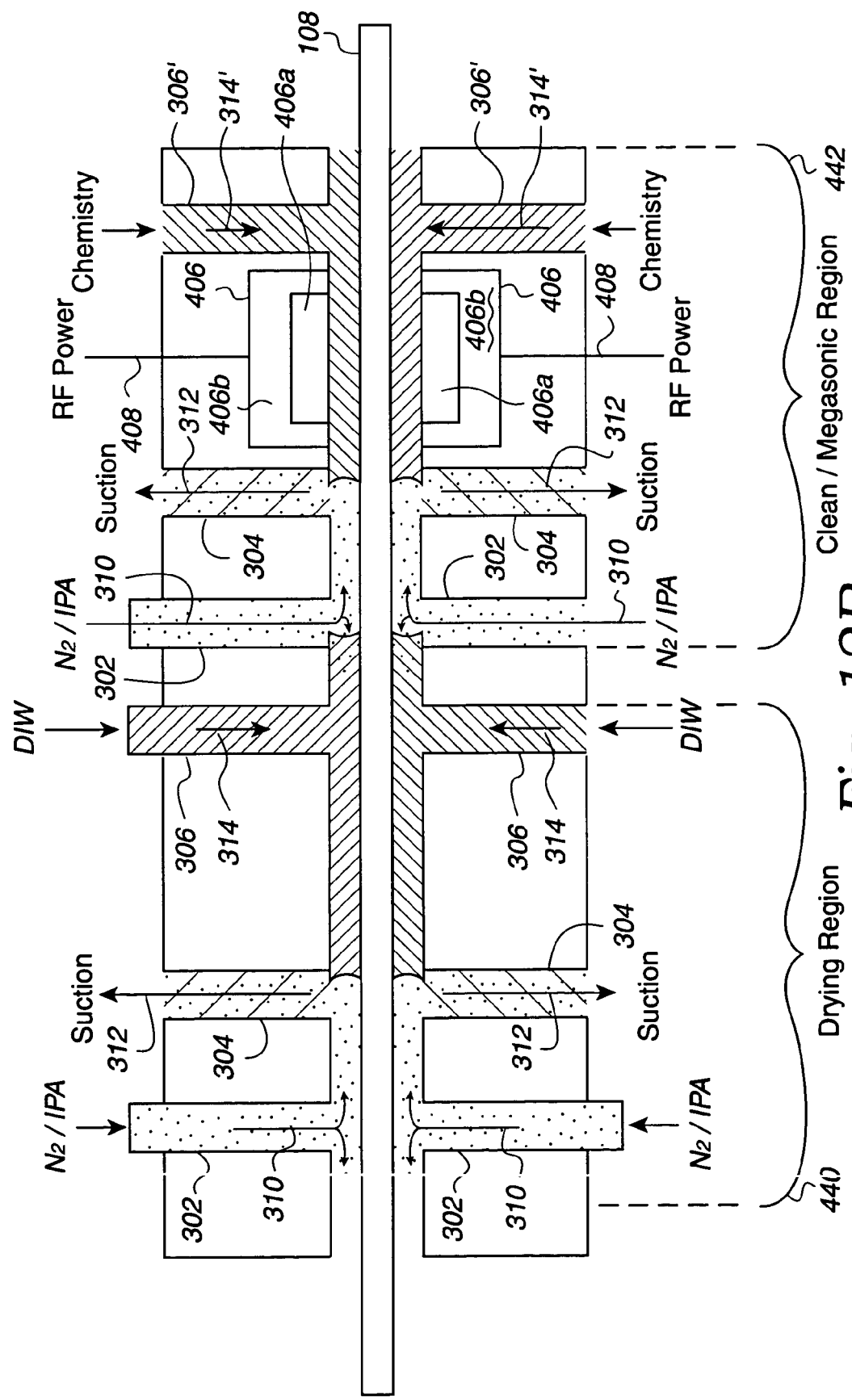
FIG. 12B shows a side view of proximity heads with dual megasonic transducers in the clean/megasonic region in accordance with one embodiment of the present invention.

FIG. 12B shows a side view of proximity heads 106a and 106b with dual megasonic transducers in the clean/megasonic region 442 in accordance with one embodiment of the present invention. In one embodiment, both the proximity heads 106a and 106b each include transducers that may turn RF into acoustic energy. In one embodiment, the proximity head 106b has the same configuration of the proximity head 106a except the proximity head 106b positioned to process the other side of the wafer 108. In one embodiment, the transducers 406 of both the heads 106a and 106b may be configured to output megasonic waves directly to the meniscus 116. In a preferable embodiment, the transducers 406 may be configured to output megasonic waves directly to the meniscuses 116 on both sides of the wafer 108. It should also be appreciated that the transducers may be located in any portion of the proximity heads 106a and 106b that may enable acoustic waves to be outputted directly to the meniscus 116 that is cleaning the wafer. In a preferable embodiment, the location of the transducers 406 may be in the location as described above in reference to FIG. 12A.

Figure 13:
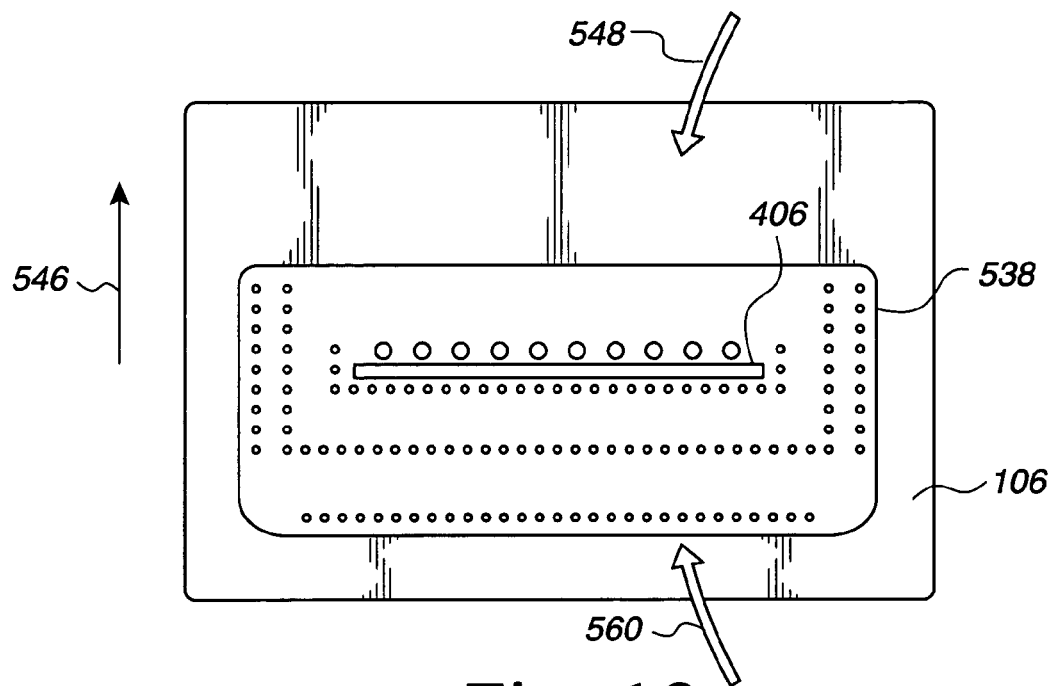
FIG. 13 shows an exemplary process window with the plurality of source inlets and as well as the plurality of source outlets in accordance with one embodiment of the present invention.

FIG. 13 shows an exemplary process window 538 with the plurality of source inlets 302 and 306 as well as the plurality of source outlets 304 in accordance with one embodiment of the present invention. In one embodiment, the process window 538 in operation may be moved in direction 546 across a wafer during, for example, a wafer cleaning operation. The process window 538 is the location where the meniscus 116 may be formed. In such an embodiment, a proximity head 106 may encounter contaminated areas on a wafer surface on a leading edge region 548. The leading edge region 548 is an area of the proximity head 106 that, in a cleaning process, encounters contaminants first. Conversely a trailing edge region 560 is an area of the proximity head 106 that encounters the area being processed last. As the proximity head 106 and the process window 538 included therein move across the wafer in the direction 546, the dirty area (or a wet area in a drying operation) of the wafer surface enter the process window 538 through the leading edge region 548. Then after processing of the unclean region (or a wet region in a drying process) of the wafer surface by the meniscus that is generated and controllably maintained and managed by the process window 538, the unclean region is cleaned and the cleaned region of the wafer (or substrate) leaves the process window 538 through a trailing edge region 560 of the proximity head 106. In an alternative embodiment, a wet region is dried and the dried region of the wafer leaves the process window 538 through the trailing edge region 560 of the proximity head 106.

In one embodiment, the transducer 406 may be defined between the source inlets and the source outlets. Therefore, the transducer 406 may be defined within the process window 538 in a manner that enables the transducer 406 to directly apply acoustic waves to a meniscus formed by the process window 538. Therefore the cleaning chemistry that make up the meniscus 116 and the cavitations formed within the meniscus 116 may optimally clean the surface of the wafer.

Figure 14:
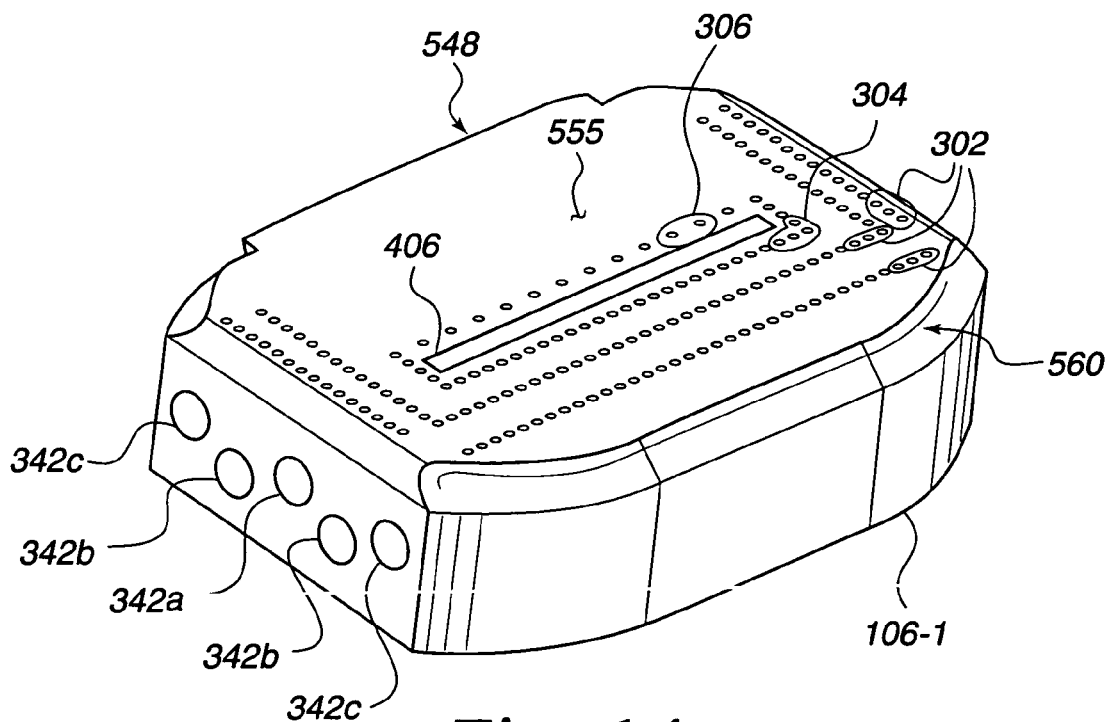
FIG. 14 shows a top view of a proximity head with a substantially rectangular shape in accordance with one embodiment of the present invention.

It should be appreciated any of the different embodiments of the proximity head 106 described may be used as one or both of the proximity heads 106a and 106b described above in reference to FIGS. 2A through 5H. The proximity head may be any suitable configuration or size that may enable the fluid removal and/or cleaning process as described in FIGS. 6 to 12. In addition, exemplary proximity heads and their respective patterns of the source inlets 302 and 304 as well as the source outlets 306 may be seen in U.S. patent applications Ser. Nos. 10/261,839, 10/404,270, and 10/330,897 which have been incorporated by reference. Therefore, any, some, or all of the proximity heads described herein may be utilized in any suitable wafer cleaning and drying system such as, for example, the system 100 or a variant thereof as described in reference to FIGS. 2A to 2D. In addition, the proximity head may also have any suitable numbers or shapes of source outlets 304 and source inlets 302 and 306. Moreover, the transducer 406 may be any suitable size, shape, and number as long the transducer 406 may apply acoustic waves to the meniscus 116. It should be appreciated that the side of the proximity heads shown from a top view is the side that comes into close proximity with the wafer to conduct wafer processing. The proximity head described in FIG. 14 is a manifold that enables usage of the IPA-vacuum-liquid orientation as described above in reference to FIGS. 2 through 12. In addition, the proximity heads described herein may be utilized for either cleaning or drying operations depending on the fluid that is inputted and outputted from the source inlets 302 and 306, and the source outlets 304. In addition, the proximity heads described herein may have multiple inlet lines and multiple outlet lines with the ability to control the relative flow rates of liquid and/or vapor and/or gas through the outlets and inlets. It should be appreciated that every group of source inlets and source outlets can have independent control of the flows.

It should be appreciated that the size as well as the locations of the source inlets and outlets may be varied as long as the meniscus produced is stable. In one embodiment, the size of the openings to source inlets 302, source outlets 304, and source inlets 306 are between about 0.02 inch and about 0.25 inch in diameter. In a preferable embodiment, the size of the openings of the source inlets 306 and the source outlets 304 is about 0.06 inch, and the size of the openings of the source inlets 302 is about 0.03 inch.

In one embodiment the source inlets 302 and 306 in addition to the source outlets 304 are spaced about 0.03 inch and about 0.5 inch apart. In a preferable embodiment, the source inlets 306 are spaced 0.125 inch apart from each other and the source outlets 304 are spaced 0.125 inch apart and the source inlets 302 are spaced about 0.06 inch apart. In one embodiment, the source inlets 302, the source outlets 304 may be combined in the form of one or more slots or channels rather than multiple openings. By way of example, the source outlets 304 may be combined in the form of one or more channels that at least partially surrounds the area of the source outlets 306 for the portion of the meniscus. Similarly, the IPA outlets 302 can be combined into one or more channels that lie outside the area of the source inlets 304. The source outlets 306 can also be combined into one or more channels.

Additionally, the proximity heads may not necessarily be a "head" in configuration but may be any suitable configuration, shape, and/or size such as, for example, a manifold, a circular puck, a bar, a square, an oval puck, a tube, plate, etc., as long as the source inlets 302, and 306, and the source outlets 304 may be configured in a manner that would enable the generation of a controlled, stable, manageable fluid meniscus. A single proximity head can also include sufficient source inlets 302 and 306, and the source outlets 304 such that the single proximity head can also support multiple meniscuses. The multiple meniscuses can simultaneously perform separate functions (e.g., etch, rinse, and drying processes). In a preferable embodiment, the proximity head may be a type of manifold as described in reference to FIGS. 9A through 12B. The size of the proximity heads may be varied to any suitable size depending on the application desired. In one embodiment, the length (from a top view showing the process window) of the proximity heads may be between 1.0 inch to about 18.0 inches and the width (from a top view showing the process window) may be between about 0.5 inch to about 6.0 inches. Also when the proximity head may be optimized to process any suitable size of wafers such as, for example, 200 mm wafers, 300, wafers, etc. The process windows of the proximity heads may be arranged in any suitable manner as long as such a configuration may generate a controlled stable and manageable fluid meniscus.

FIG. 14 shows a top view of a proximity head 106-1 with a substantially rectangular shape in accordance with one embodiment of the present invention. In this embodiment, the proximity head 106-1 includes three of the source inlets 302 which, in one embodiment, applies IPA to a surface of the wafer 108.

In this embodiment, the source inlets 302 are capable of applying IPA toward a wafer surface region, the source inlets 306 are capable of applying cleaning chemistry toward the wafer surface region, and the source outlets 304 are capable of applying vacuum to a region in close proximity of a surface of the wafer 108. By the application of the vacuum, the IPA, cleaning chemistry, and any other type of fluids that may reside on a wafer surface may be removed.

The proximity head 106-1 also includes ports 342a, 342b, and 342c that, in one embodiment, correspond to the source inlet 302, source outlet 304, and source inlet 306 respectively. By inputting or removing fluid through the ports 342a, 342b, and 342c, fluids may be inputted or outputted through the source inlet 302, the source outlet 304, and the source inlet 306. Although the ports 342a, 342b, and 342c correspond with the source inlet 302, the source outlet 304, and the source inlet 306 in this exemplary embodiment, it should be appreciated that the ports 342a, 342b, and 342c may supply or remove fluid from any suitable source inlet or source outlet depending on the configuration desired. Because of the configuration of the source inlets 302 and 306 with the source outlets 304, the meniscus 116 may be formed between the proximity head 106-1 and the wafer 108. The shape of the meniscus 116 may vary depending on the configuration and dimensions of the proximity head 106-1.

It should be appreciated that the ports 342a, 342b, and 342c for any of the proximity heads described herein may be any suitable orientation and dimension as long as a stable meniscus can be generated and maintained by the source inlets 302, source outlets 304, and source inlets 306. The embodiments of the ports 342a, 342b, and 342c described herein may be applicable to any of the proximity heads described herein. In one embodiment, the port size of the ports 342a, 342b, and 342c may be between about 0.03 inch and about 0.25 inch in diameter. In a preferable embodiment, the port size is about 0.06 inch to 0.18 inch in diameter. In one embodiment, the distance between the ports is between about 0.125 inch and about 1 inch apart. In a preferable embodiment, the distance between the ports is between about 0.25 inch and about 0.37 inch apart.

In one embodiment, the transducer 406 is located in between the source inlets 306 and the source outlets 304. It should be appreciated that the transducer 406 may be located in any suitable region of the head 106-1 as long as the transducer 406 may apply acoustic waves to the meniscus 116. Therefore, the transducer 406 may apply acoustic waves such as, for example, ultrasonic waves and/or megasonic waves to the meniscus 116 as described above in reference to FIGS. 9A through 12B. Consequently, by use of cleaning chemicals and megasonics, the cleaning of wafer surfaces may be intelligently optimized and enhanced.

While this invention has been described in terms of several preferred embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

What is claimed is:

1. A head having a head surface, the head used in a substrate preparation apparatus, the head configured to be disposed proximate to a surface of a substrate, comprising:
    at least one of a first source inlet for delivering a first fluid to the surface of the substrate through the head;
    at least one of a second source inlet for delivering a second fluid to the surface of the substrate through the head, the second fluid being different than the first fluid;
    at least one of a source outlet for removing each of the first fluid and the second fluid from the surface of the substrate, at least a portion of the at least one of the source outlet being located in between the at least one of the first source inlet and the at least one of the second source inlet; and
    a transducer disposed in the head for applying acoustic energy at a location between the at least one of a first source inlet and the source outlet;

wherein the head surface has substantially flat surface regions, and the head surface is defined so that the at least one of the first source inlet, the second source inlet and the source outlet are defined by discrete holes that reside at the head surface and extend through the substantially flat surface regions of the head surface.

2. The head as recited in claim 1, wherein the first fluid is a cleaning chemistry.

3. The head as recited in claim 1, wherein the transducer includes a body and a piezoelectric crystal defined in the body.

4. The head as recited in claim 3, wherein the transducer is attached to an RF supply and the piezoelectric crystal within the transducer is capable of receiving RF and generating the acoustic energy.

5. The head as recited in claim 1, wherein the acoustic energy is at least one of an ultrasonic waves and megasonic waves.

6. The head as recited in claim 1, wherein the transducer is configured to apply megasonic waves to a fluid meniscus defined by the first or second fluid.

7. The head of claim 1, wherein the at least one of the second source inlet surrounds at least a trailing edge side of the at least one of the source outlet.

8. A head having a head surface, the head used in a substrate preparation apparatus, the head configured to be disposed proximate to a surface of a substrate, comprising:
 a plurality of first source inlets for delivering a first fluid to the surface of the substrate through the head;
 a plurality of second source inlets for delivering a second fluid to the surface of the substrate through the head;
 a plurality of source outlets for at least partially removing each of the first fluid and the second fluid from the surface of the substrate to define a meniscus, and at least a portion of the plurality of source outlets being aligned in between the plurality of first source inlets and the plurality of second source inlets; and
 a transducer disposed in the head at a position that is adjacent to the head surface, the transducer defined to apply acoustic energy in a region of the head surface that is between the plurality of first source inlets and the plurality of source outlets;
 wherein the head surface has substantially flat surface regions, and the head surface is defined so that the first source inlets, the second source inlets and the source outlets are defined by discrete holes that reside at the head surface and extend through the substantially flat surface regions of the head surface.

9. The head of claim 8, wherein the transducer includes a body and a piezoelectric crystal defined in the body.

10. The head of claim 9, wherein the transducer is attached to an RF supply and the piezoelectric crystal within the transducer is coupled to RF power to define acoustic energy.

11. The head of claim 9, wherein the acoustic energy is one of an ultrasonic waves or megasonic waves.

12. The head of claim 8, wherein the transducer is configured to apply megasonic waves to a fluid meniscus.

* * * * *